(12) United States Patent
Kobayashi et al.

(10) Patent No.: US 6,667,925 B2
(45) Date of Patent: Dec. 23, 2003

(54) SEMICONDUCTOR DEVICE HAVING TEMPERATURE DETECTING FUNCTION, TESTING METHOD, AND REFRESH CONTROL METHOD OF SEMICONDUCTOR STORAGE DEVICE HAVING TEMPERATURE DETECTING FUNCTION

(75) Inventors: Isamu Kobayashi, Kasugai (JP); Yoshiharu Kato, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/081,232

(22) Filed: Feb. 25, 2002

(65) Prior Publication Data

US 2003/0081484 A1 May 1, 2003

(30) Foreign Application Priority Data

Oct. 29, 2001 (JP) ........................................ 2001-331304

(51) Int. Cl.[7] .................................................. G11C 7/04
(52) U.S. Cl. .................. 365/211; 365/222; 365/189.09; 365/189.11
(58) Field of Search ............................ 365/189.09, 211, 365/222, 212, 189.07, 189.11, 242, 243

(56) References Cited

U.S. PATENT DOCUMENTS 5,680,359 A * 10/1997 Jeong .......................... 365/222
5,784,328 A *  7/1998 Irrinki et al. ................ 365/222

FOREIGN PATENT DOCUMENTS

JP            6-347337            12/1994

* cited by examiner

Primary Examiner—David Lam
(74) Attorney, Agent, or Firm—Arent Fox Kintner Plotkin & Kahn, PLLC

(57) ABSTRACT

A semiconductor device, a testing method and a refresh control method having a temperature detecting function to detect a predetermined temperature with little dispersion and to optimize the acting state in accordance with the predetermined temperature detected. The semiconductor device includes at least a memory cell, a refresh control circuit for switching the refresh period tREF of the memory cell, and a temperature detecting unit to be biased with a bias voltage VB+ coming from a voltage bias unit including a reference unit and a regulator unit.

33 Claims, 28 Drawing Sheets

FIRST MODIFICATION OF FIRST AND SECOND EMBODIMENTS

SEMICONDUCTOR DEVICE HAVING TEMPERATURE
DETECTING FUNCTION OF FIRST EMBODIMENT

SEMICONDUCTOR MEMORY HAVING TEMPERATURE
DETECTING FUNCTION OF SECOND EMBODIMENT

FIG. 4 TEMPERATURE DEPENDENCY IN REFRESH CONTROL CHARACTERISTICS OF SEMICONDUCTOR MEMORY OF SECOND EMBODIMENT

FIRST MODIFICATION OF FIRST AND SECOND EMBODIMENTS

SECOND MODIFICATION OF FIRST AND SECOND EMBODIMENTS

SPECIFIC EXAMPLE OF REFERENCE UNIT

OUTPUT CHARACTERISTICS OF SPECIFIC EXAMPLE OF REFERENCE UNIT

FIG. 9  SPECIFIC EXAMPLE OF VOLTAGE BIAS UNIT IN FIRST MODIFICATION

SPECIFIC EXAMPLE OF REFERENCE UNIT IN FIRST MODIFICATION

SPECIFIC EXAMPLE (BIAS VOLTAGE VB+) OF REGULATOR UNIT

SPECIFIC EXAMPLE (BIAS VOLTAGE VB−) OF REGULATOR UNIT

SPECIFIC EXAMPLE OF TRANSISTOR LEVEL OF FIG. 11

SPECIFIC EXAMPLE OF TEMPERATURE DETECTING UNIT

FIG. 15 TEMPERATURE CHARACTERISTICS IN SPECIFIC EXAMPLE OF TEMPERATURE DETECTING UNIT

FIRST SPECIFIC EXAMPLE OF DIODE STRUCTURE OF TEMPERATURE DETECTING UNIT

SECOND SPECIFIC EXAMPLE OF DIODE STRUCTURE OF TEMPERATURE DETECTING UNIT

PREDETERMINED TEMPERATURE DEPENDENCY (FOR STATE CHANGE ON HIGH TEMPERATURE SIDE) IN BIAS VOLTAGE APPLIED TO TEMPERATURE DETECTING UNIT

PREDETERMINED TEMPERATURE DEPENDENCY (FOR STATE CHANGE ON LOW TEMPERATURE SIDE) IN BIAS VOLTAGE APPLIED TO TEMPERATURE DETECTING UNIT

FIG. 20 FIRST SPECIFIC EXAMPLE OF REFRESH CONTROL CIRCUIT

FIG. 21 SECOND SPECIFIC EXAMPLE OF REFRESH CONTROL CIRCUIT

FIG. 22  THIRD SPECIFIC EXAMPLE OF REFRESH CONTROL CIRCUIT

FIG. 23  FOURTH SPECIFIC EXAMPLE OF REFRESH CONTROL CIRCUIT

TEMPERATURE DETECTING UNIT IN THIRD EMBODIMENT

FIG. 25 TEMPERATURE CHARACTERISTICS AT TEMPERATURE DETECTING UNIT OF THIRD EMBODIMENT

FIG. 26 TEMPERATURE CHARACTERISTICS AT TEMPERATURE DETECTING UNIT OF THIRD EMBODIMENT (FOR HIGH RESISTANCE)

FIG. 27 (PRIOR ART) EXAMPLE OF TEMPERATURE CHARACTERISTICS OF SEMICONDUCTOR DEVICE MADE OF CMOS DEVICE ELEMENTS

BLOCK DIAGRAM SHOWING REFRESH CONTROL UNIT OF SEMICONDUCTOR MEMORY IN THE PRIOR ART

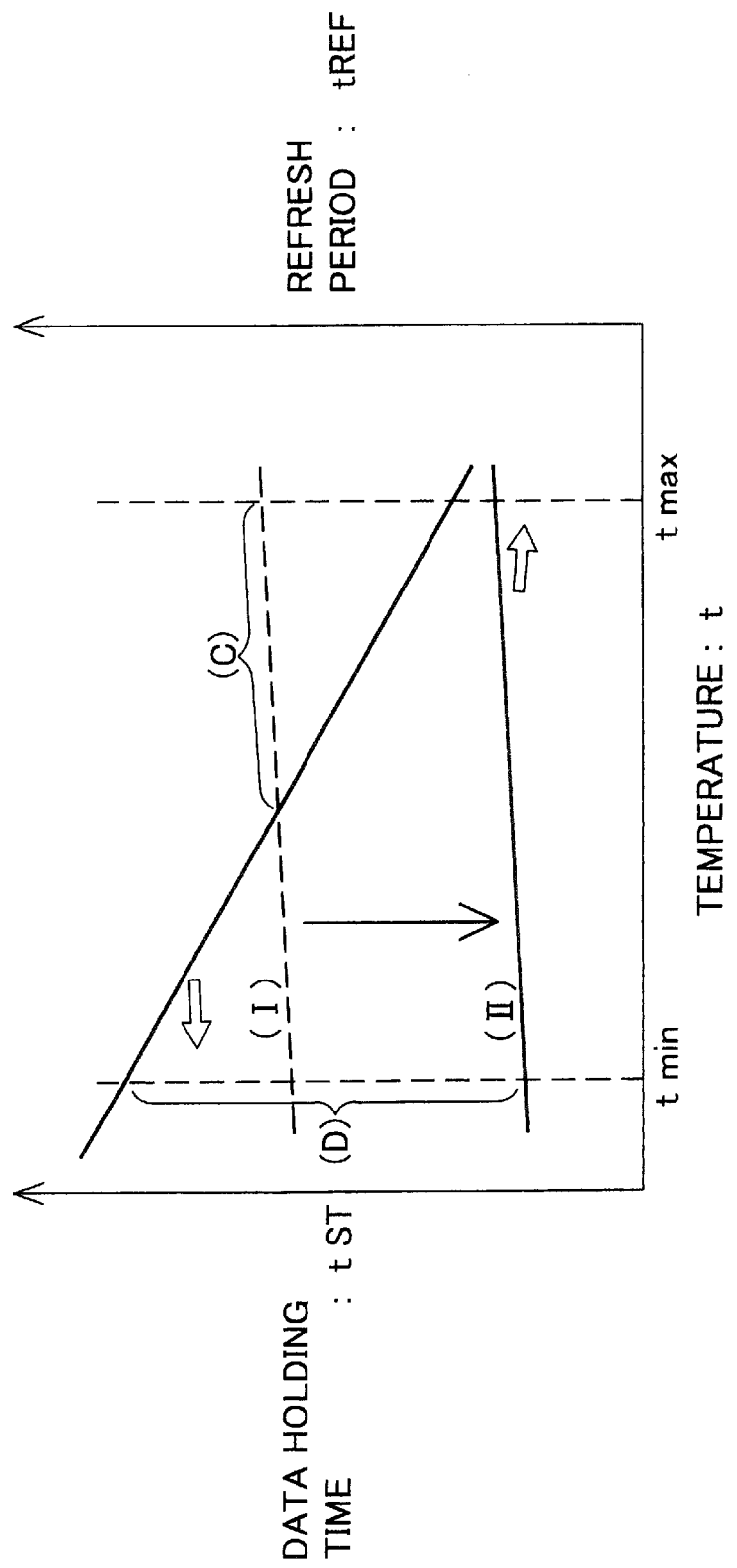
FIG. 29 TEMPERATURE DEPENDENCY IN REFRESH CONTROL CHARACTERISTICS OF SEMICONDUCTOR MEMORY
(PRIOR ART)

SEMICONDUCTOR DEVICE HAVING TEMPERATURE DETECTING FUNCTION, TESTING METHOD, AND REFRESH CONTROL METHOD OF SEMICONDUCTOR STORAGE DEVICE HAVING TEMPERATURE DETECTING FUNCTION

BACKGROUND OF THE INVENTION

1. Field of the Invention

The present invention relates to a semiconductor device having a temperature detecting function to optimize the acting state in accordance with a detected temperature detected with little dispersion, so as to achieve a sufficient acting performance over the entire working temperature range including a lower temperature region and a higher temperature region and, more particularly, to an improvement in the acting performance in a semiconductor storage device.

2. Description of Related Art

Generally, a semiconductor device element constructing a semiconductor device has temperature characteristics, and a semiconductor device constructed by integrating the semiconductor device elements has temperature characteristics from its acting characteristics. Moreover, the semiconductor device is generally employed in a predetermined temperature range and is demanded to have predetermined temperature characteristics for the entire working temperature range.

FIG. 27 illustrates a consumed current IDD and various action speeds tACCESS, i.e., representative acting characteristics against the temperature for a semiconductor device constructed of CMOS device elements. Generally in the semiconductor device constructed of CMOS device elements, as illustrated in FIG. 27, the action speed tACCESS becomes the lower at the higher temperature, and the consumed current IDD becomes the higher at the lower temperature. The individual acting characteristics are warranted under the worst conditions so that the various acting speeds tACCESS are warranted (at (A) in FIG. 27) with the maximum tmax in the working temperature range, and the consumed current IDD is warranted (at (B) in FIG. 27) with the minimum tmin in the working temperature range. As a result, the specifications on the acting characteristics in the entire working temperature range (from tmin to tmax) are warranted.

For a semiconductor memory representing the semiconductor device constructed of CMOS device elements, the internal construction (FIG. 28) and the temperature characteristics (FIG. 29) of the construction are shown in FIGS. 28 and 29. Here are illustrated the temperature characteristics on the refresh control of a semiconductor memory 100 requiring the refresh action, such as a dynamic random access memory (as will be abbreviated into "DRAM") of the semiconductor memory.

In the prior art, as shown in FIG. 28, the semiconductor memory 100 is controlled on a refresh period tREF of a memory cell 102 by a refresh control circuit 101. In the memory cell 102, as illustrated in FIG. 29, the leakage current increases with the rise in the temperature so that the data holding characteristics are deteriorated by the electric charge to exhibit the negative temperature characteristics in which a data holding time tST is shortened.

On the other hand, the refresh period tREF to be set by the refresh control circuit 101 is set by an oscillation circuit such as a ring oscillator. According to the temperature characteristics of the various action speeds tACCESS of CMOS device elements, however, the action speeds tACCESS are raised the higher at the lower temperature. As a result, there is a tendency in which the positive temperature characteristics appear for the working temperature (at (II) in FIG. 29). With the setting (at (I) in FIG. 29) of the refresh period tREF to cross the data holding time tST in the working temperature range, there exists a temperature region (at (C) in FIG. 29) in which the refresh period tREF is longer than the data holding time tST, so that the data in the memory cell 102 undesirably disappear.

It is, therefore, customary to set the refresh period tREF (at (II) in FIG. 29) to cross the data holding time tST at a temperature exceeding the maximum tmax in the working temperature range. As a result, the refresh action is done for the refresh period tREF shorter than the data holding time tST in the entire working temperature range (from tmin to tmax), so that the data stored in the memory cell 102 do not disappear.

In the semiconductor device exemplified by CMOS device elements, however, the action warranty of the consumed current IDD and the various action speeds tACCESS are regulated by the minimum tmin and the maximum tmax in the working temperature range other than the ordinary one, so that the system employing the semiconductor device is designed/manufactured on the basis of the warranting values. Therefore, a fear and a problem arise in that the system sufficiently utilizing the acting performance of the semiconductor device in the ordinary working temperature region cannot be constructed.

In the semiconductor memory 100, moreover, the refresh period tREF to be set in the lower temperature region of the working temperature range is set excessively short (at (D) in FIG. 29) due to not only the negative temperature characteristics of the data holding time tST but also the positive temperature characteristic tendency of the refresh period tREF. Therefore, the refresh control circuit 101 performs the refresh actions for a sufficiently shorter time than the data holding time tST of the memory cell 102 and in an excessive frequency more than necessary. The current consumption accompanying the excessive refresh action is so surplus that the consumed current IDD in the lower temperature region cannot be sufficiently reduced to raise a problem that the action characteristics of the consumed current IDD warranted with the minimum tmin in the working temperature range cannot be improved.

Especially in a mobile device in which the semiconductor memory 100 is ordinarily employed at a temperature lower than the room temperature, the continuous employing time by the battery drive is restricted to raise a problem by the consumed current IDD accompanying the excessive refresh action in a temperature region lower than the room temperature.

SUMMARY OF THE INVENTION

The present invention has been conceived to solve the above-specified problems of the prior art and has an object to provide a semiconductor device having a temperature detecting function to detect a predetermined temperature with little dispersion and to optimize the acting state in accordance with the predetermined temperature detected, a testing method, and a refresh control method of a semiconductor memory device having the temperature detecting function.

In order to achieve the object, according to one aspect of the present invention, there is provided a semiconductor device having a temperature detecting function, comprising: a temperature detecting unit for detecting a predetermined temperature; and a voltage biasing unit for outputting a predetermined voltage having a slight temperature dependency or a predetermined voltage having a predetermined temperature dependency, to bias the temperature detecting unit.

In the semiconductor device having the aforementioned temperature detecting function, the temperature detecting unit for detecting the predetermined temperature is biased with either the predetermined voltage having the slight temperature dependency or the predetermined voltage having the predetermined temperature dependency, as outputted from the voltage bias unit.

With the temperature dependency of the predetermined voltage for biasing the temperature detecting unit being slight, therefore, the generally constant predetermined voltage is biased as the DC characteristics to the temperature detecting unit so that the detecting precision of the temperature detecting unit can be improved. The predetermined temperature to be detected is not fluctuated by the fluctuations of the bias voltage so that the temperature can be stably detected. If the predetermined voltage for biasing the temperature detecting unit has the predetermined temperature dependency, moreover, the fluctuations of the temperature to be detected can be in the temperature direction margin for the predetermined temperature so that the temperature can be stably detected.

According to another aspect of the present invention, moreover, there is provided a semiconductor device having a temperature detecting function, comprising: a temperature detecting unit for detecting a predetermined temperature; a first voltage biasing unit for outputting a first voltage to bias the positive supply side of the temperature detecting unit; and a second voltage biasing unit for outputting a second voltage dropped by a predetermined voltage from the first voltage biasing unit, to bias the negative supply side of the temperature detecting unit, wherein the temperature detecting unit is biased with the predetermined voltage.

In the semiconductor device having the aforementioned temperature detecting function, the first voltage is applied to the positive supply side of the temperature detecting unit, and the second voltage is applied to the negative supply side so that the voltage difference between the positive supply side and the negative supply side is kept at the predetermined voltage.

As a result, the first voltage to be applied to the positive supply side of the temperature detecting unit and the second voltage to be applied to the negative supply side keep the voltage difference of a predetermined voltage so that the predetermined voltage is biased as the DC characteristics between the positive/negative supply sides of the temperature detecting unit. If the equivalent in-phase transient responsive output characteristics are given as the voltage difference between the first and second voltages, moreover, the voltage difference at the predetermined voltage can be kept as the transient responsive characteristics. The predetermined voltage is always biased between the positive/negative supply sides of the temperature detecting unit so that the temperature can be stably detected without any fluctuation of the predetermined temperature to be detected, as might otherwise be made by the bias voltage.

According to one aspect of the present invention, moreover, there is provided a method for testing a semiconductor device having a temperature detecting function, comprising: a testing temperature detecting step of detecting a testing temperature at a temperature characteristic testing time; an error measuring step of measuring an error quantity of the detected result of the testing temperature; and a correction step of correcting a temperature detecting unit for detecting a predetermined temperature, on the basis of the measured error quantity.

According to the testing method for the semiconductor device having the aforementioned temperature detecting function, the error quantity of the detected result of the testing temperature at the temperature characteristic testing time is measured to make the correction of the temperature detecting unit for detecting the predetermined temperature on the basis of the error quantity.

As a result, the detection of the testing temperature is done by the temperature characteristic tests of the prior art, and the error quantity from the actual testing temperature is measured so that the temperature detecting unit for detecting the predetermined temperature can be relatively corrected on the basis of the error quantity. Without any temperature detecting test at the predetermined temperature to be detected by the predetermined temperature detecting unit or the temperature detecting unit, the temperature detecting unit can be relatively corrected to shorten the testing time thereby to compress the testing cost.

According to another aspect of the present invention, moreover, there is provided a method for testing a semiconductor device having a temperature detecting function, comprising: a testing temperature detecting step of making at least two kinds of detections of a testing temperature, the detection of a first near temperature having a slight detecting temperature difference on a higher temperature side with respect to the testing temperature and the detection of a second near temperature having a slight detecting temperature difference on a lower temperature side, at a temperature characteristic testing time; an error measuring step of measuring the difference till the detected results of the two end temperatures of the at least two kinds of detections are contrary to each other, as a detection error; and a correction step of correcting a temperature detecting unit for detecting a predetermined temperature on the basis of the measured error quantity.

According to the testing method of the semiconductor device having the aforementioned temperature detecting function, at the time of detecting the testing temperature at the temperature characteristic testing time, there are obtained at least two temperature detecting results which are selected from the testing temperature and the first and second near temperatures across the testing temperature. Moreover, the difference till the detection results of the two end temperatures are contrary to each other is measured as the detector error, and the temperature detecting unit for detecting the predetermined temperature is corrected on the basis of the error quantity.

As a result, the testing temperature is detected at the temperature characteristic tests of the prior art, and the error quantity from the actual testing temperature is measured, so that the temperature detecting unit for detecting the predetermined temperature can be relatively corrected on the basis of the error quantity. Without any temperature detecting test at the predetermined temperature detecting unit or the predetermined temperature to be detected at the temperature detecting unit, the temperature detecting unit can be relatively corrected to shorten the testing time thereby to compress the testing cost.

Moreover, the testing temperature or at least two temperatures having the slight temperature difference selected from the near temperature are detected so that the testing temperatures are confined within the slight temperature difference while the two detected results being contrary to each other. By adjusting the slight temperature difference, the detecting precision of the testing temperature can be adjusted to adjust the precision of the error quantity of the detected results thereby to correct the temperature detecting unit relatively in a high precision.

Moreover, it is possible to judge to which of the higher temperature side/lower temperature side the detected results are shifted with respect to the actual testing temperature thereby to execute the correcting procedure efficiently.

According to one aspect of the present invention, moreover, there is provided a refresh control method of a semiconductor storage device having a temperature detecting function, wherein the period of a refresh action is switched according to a detected temperature detected by a temperature detecting unit.

In the refresh control method of the semiconductor storage device having the aforementioned temperature detecting function, the period of the refresh action is switched according to the temperature which is detected by the temperature detecting unit.

As a result, the refresh action can be made for the period matching the holding characteristics of the stored charge of the memory cell having the temperature dependency, to hold the data over the wide temperature range, and the refresh action more than necessary can be suppressed to reduce the consumed current accompanying the refresh action.

The above and further objects and novel features of the invention will more fully appear from following detailed description when the same is read in connection with the accompanying drawings. It is to be expressly understood, however, that the drawings are for the purpose of illustration only and are not intended as a definition of the limits of the invention.

BRIEF DESCRIPTION OF THE DRAWINGS

FIG. 29 is a characteristic diagram illustrating a temperature dependency in the refresh control characteristics of the semiconductor memory.

DETAILED DESCRIPTION OF THE PREFERRED EMBODIMENTS

With reference to FIGS. 1 to 26, here will be detailed first to third embodiments embodying a semiconductor device having a temperature detecting function, a testing method, and a refresh control method of the semiconductor storage device having the temperature detecting function according to the present invention.

Figure 1:
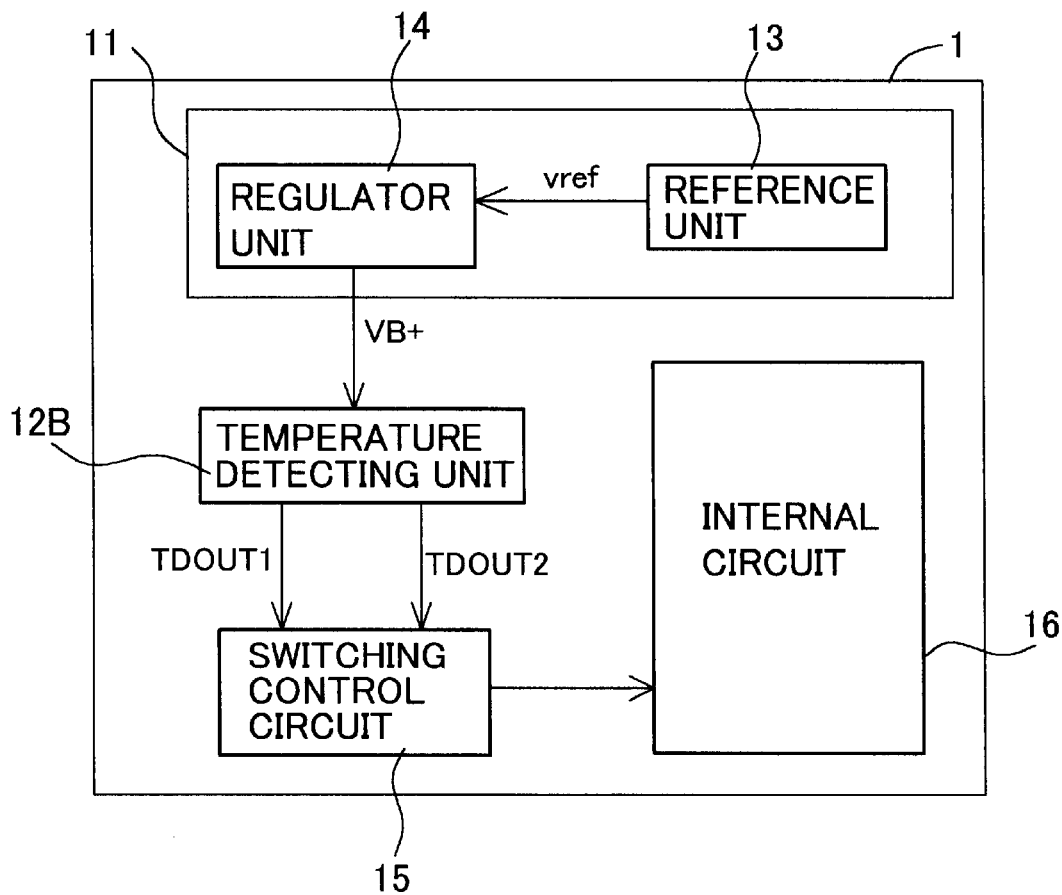
FIG. 1 is a circuit block diagram showing a semiconductor device having a temperature detecting function of a first embodiment.

A semiconductor device 1 having a temperature detecting function of a first embodiment, as shown in FIG. 1, comprises an internal circuit 16 and a switching control circuit 15 for switching the action state of the internal circuit 16. Further comprised are a voltage bias unit 11 including a reference unit 13 and a regulator unit 14, and a temperature detecting unit 12B to be biased with a bias voltage VB+ from the regulator unit 14.

The reference unit 13 is a component to be fed with an electric power by either an external supply voltage fed from the outside or an internal drop power supply dropped internally from the external supply voltage, to output a reference voltage vref. The reference voltage vref to be output is output stably for supply voltage fluctuations and as a voltage having a little or predetermined temperature dependency.

On the other hand, the regulator unit 14 is a component for outputting the bias voltage VB+ for the reference voltage vref input. The regulator unit 14 is provided for retaining a sufficient driving ability, in the case where the reference voltage vref from the reference unit 13 is insufficient for driving the post temperature detecting unit 12B. In addition to the buffer type construction in which the bias voltage VB+ is output at the same level as the reference voltage vref, there can be made a level shift type construction in which the voltage level is transformed with a resistance-divided voltage or the like from the reference voltage vref and is output. On the basis of the fact that the reference voltage vref is a stable voltage, the bias voltage VB+ is also output as a stable predetermined voltage.

The temperature detecting unit 12B is a component for detecting a predetermined temperature within the working temperature range of the semiconductor device 1. The temperature detecting unit 12B is biased with the bias voltage VB+ having the stable predetermined voltage so that it can detect the predetermined temperature stably. The detected result of the predetermined temperature is output as detected signals TDOUT1 and TDOUT2 to the switching control circuit 15. Here, the temperature detecting unit 12B outputs the two kinds of detected signals TDOUT1 and TDOUT2 as the detected results of the individual temperatures so as to detect the temperatures of two points, as will be described hereinafter.

Here, it is preferable for detecting the stable predetermined temperature that the bias voltage VB+ to the temperature detecting unit 12B keeps the stable predetermined voltage. Specifically, it is preferable that the DC characteristics are stable not only at the predetermined voltage but also at the predetermined voltage without inviting the voltage fluctuations even for transient power fluctuations or ground potential fluctuations accompanying the circuit actions or the like in the semiconductor device 1. For this, it is effective that a low-pass filter or a capacitance element is disposed at a proper position on a supply path of the bias voltage VB+ or the reference voltage vref to absorb the transient noises due to the transient response of the internal circuit.

Another effective method for suppressing the transient noises is to provide the bias voltage VB+ to the temperature detecting unit 12B or the ground potential separately of the supply path to another internal circuit. If the low-pass filter or the capacitance element is then connected with the branching point of the supply path, the transient noises having occurred in another internal circuit are absorbed at the branching point. It is, therefore, preferable that the transient noises have no possibility of going round to the temperature detecting unit 12B.

In response to the detected signals TDOUT1 and TDOUT2 from the temperature detecting unit 12B, the switching control circuit 15 outputs control signals for switching the action state of the internal circuit 16 in accordance with the individual detected signals TDOUT1 and TDOUT2. As the switching of the action state in the internal circuit 16, for example, it is conceivable to intensify the driving ability of a critical path in the internal circuit 16 by increasing the number and size of transistors composing the drive circuit. Then, it is possible to improve the action speed tACCESS of the critical path. In a lower temperature region, on the contrary, it is conceivable to restrict the driving ability of the critical path. Then, it is possible to reduce a consumed current IDD in the internal circuit 16.

Figure 2:
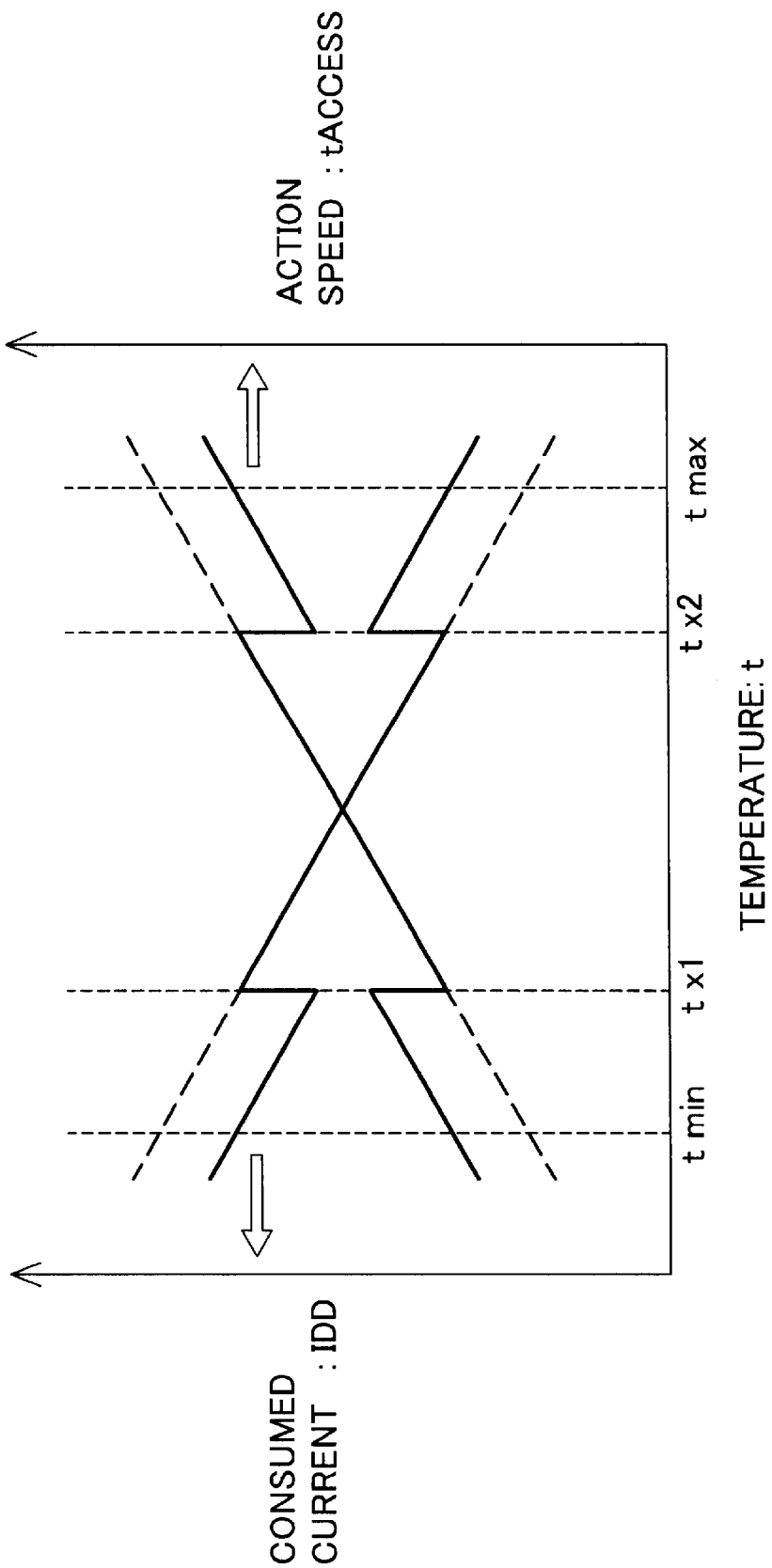
FIG. 2 is a characteristic diagram illustrating temperature characteristics in the semiconductor device of the first embodiment.

In the example of optimization of the action characteristics in the semiconductor device 1 of the first embodiment by the temperature, as illustrated in FIG. 2, the action characteristics are represented by the temperature characteristics of the consumed current IDD and the action speed tACCESS. In FIG. 2, predetermined temperatures tx1 and tx2 of two points are detected by the temperature detecting unit 12B so that the action states of the internal circuit 16 are switched at the individual temperatures tx1 and tx2.

The first predetermined temperature tx1 is a setting for improving the consumed current IDD which is warranted by the minimum tmin in the working temperature range. In response to the detected signal TDOUT1 for detecting that the detected temperature is no more than the first predetermined temperature tx1, the switching control circuit 15 outputs a control signal to restrict the driving ability of the critical path in the internal circuit 16. At or lower than the first predetermined temperature tx1, the driving ability is restricted so that the consumed current IDD is reduced to improve the characteristic warranting value. Here, the action speed tACCESS is shifted in the deteriorating direction by restricting the driving ability, but no problem arises if this shift is confined within the range of the characteristic warranting value.

On the other hand, the second predetermined temperature tx2 is a setting for improving the action speed tACCESS which is warranted by the maximum tmax in the working temperature range. In response to the detected signal TDOUT2 for detecting that the detected temperature is no less than the second predetermined temperature tx2, the switching control circuit 15 outputs a control signal to intensify the driving ability of the critical path in the internal circuit 16. At or higher than the second predetermined temperature tx2, the driving ability is intensified so that the action speed tACCESS is raised to improve the characteristic warranting value. Here, the consumed current IDD is shifted in the rising direction by intensifying the driving ability, but no problem arises if this shift is confined within the range of the characteristic warranting value.

Figure 3:
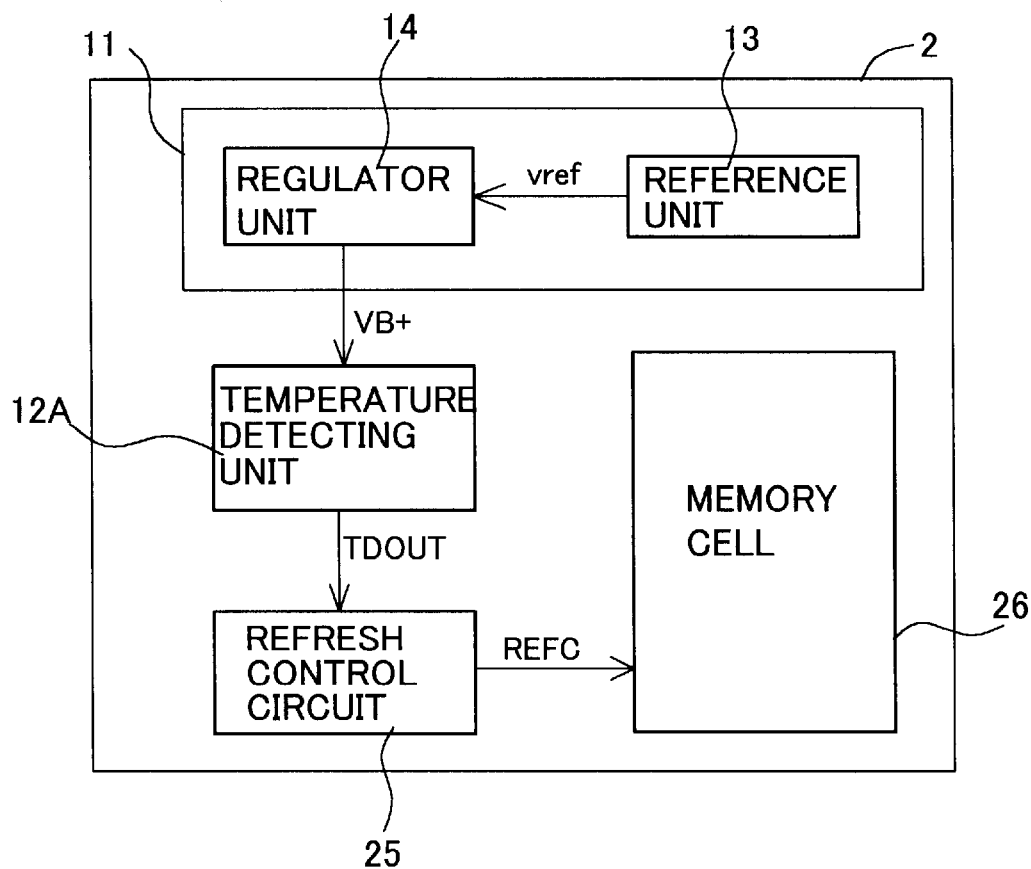
FIG. 3 is a circuit block diagram showing a semiconductor memory having a temperature detecting function of a second embodiment.

A semiconductor memory 2 having a temperature detecting function of a second embodiment, as shown in FIG. 3, is provided with a refresh control circuit 25 and a memory cell 26 as components intrinsic to the semiconductor storage device 2, in place of the switching control circuit 15 and the internal circuit 16 in the first embodiment. The semiconductor storage device 2 is further provided with a temperature detecting unit 12A in place of the temperature detecting unit 12B. Here, the same components as those of the first embodiment are designated by the common reference numerals and achieve the common actions/effects so that their descriptions are omitted.

Like the temperature detecting unit 12B, the temperature detecting unit 12A is a composing unit for detecting a predetermined temperature within the working temperature range of the semiconductor storage device 2. The temperature detecting unit 12A is biased with the bias voltage VB+ having the stable predetermined voltage so that it can stably detect a predetermined temperature. The detected result of the predetermined temperature is output as the detected signal TDOUT to the refresh control circuit 25. Here, the temperature detecting unit 12A detects the temperature of one point, as will be described hereinafter.

In response to the detected signal TDOUT from the temperature detecting unit 12A, the refresh control circuit 25 outputs a control signal for switching a refresh period tREF with the detected signal TDOUT so as to achieve stable data holding characteristics for a data holding time tST indicating negative temperature characteristics in the memory cell 26.

Figure 4:
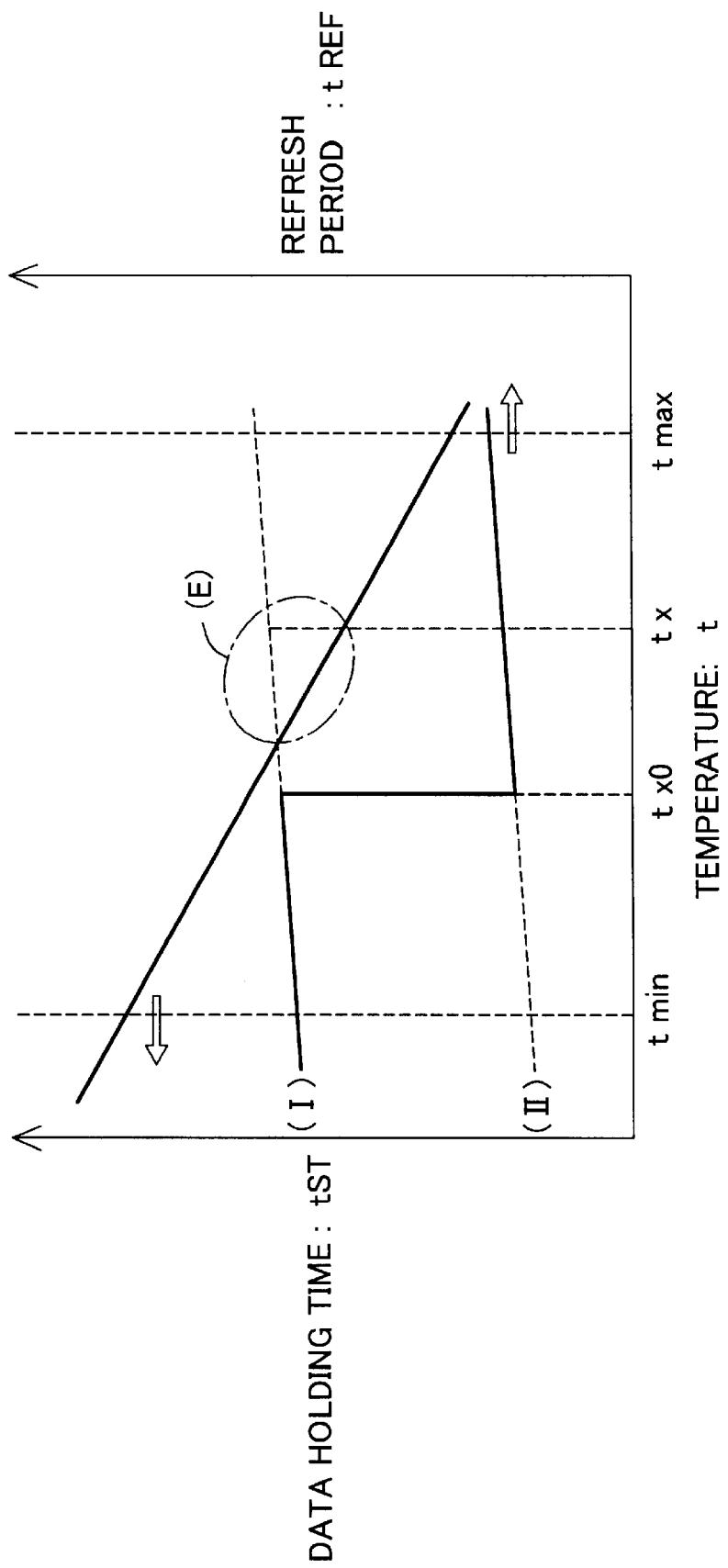
FIG. 4 is a characteristic diagram illustrating a temperature dependency in a refresh control characteristics of the semiconductor memory of the second embodiment.

FIG. 4 shows an example of optimization of the refresh period tREF in the semiconductor storage device 2 of the second embodiment with the temperature. In FIG. 4, the refresh period tREF is digitally switched at a predetermined temperature tx0 in the range of the working temperature. As a result, the refresh period tREF can be set long (at (I) in FIG. 4) within the working temperature range at or lower than the predetermined temperature tx0, while being kept (at (II) in FIG. 4) at a short period within the working temperature range of or higher than the predetermined temperature tx0.

This refresh period tREF is switched by switching the oscillation frequency of an oscillation circuit such as a ring oscillator belonging to the refresh control circuit 25, in response to the detected signal TDOUT from the temperature detecting unit 12A. In response to the data holding time tST of the memory cell 26, as elongated in the lower temperature region, the refresh period tREF can be set long to reduce the consumed current IDD in the lower temperature region thereby to improve the consumed current IDD warranted with the minimum tmin in the working temperature range.

Here, the semiconductor memory 2 having a working temperature range of 0° C. to 90° C. (tmin=0° C. and tmax=90° C.) is considered as a specific example of the temperature switching. If the predetermined temperature tx0 for switching the refresh period tREF is exemplified by 50° C. (tx0=50° C.), the refresh period tREF is set to a long period at an ordinary working temperature of or lower about 40° C. in the system such as a mobile device having the semiconductor memory 2 packaged therein. As a result, the consumed current IDD can also be reduced not only at the minimum tmin (=0° C.) of the working temperature range but also in the ordinary working temperature range. The current consumption in the ordinary working temperature range can be lowered to contribute to the elongated continuous working time in a battery-driven mobile device or the like.

Figure 5:
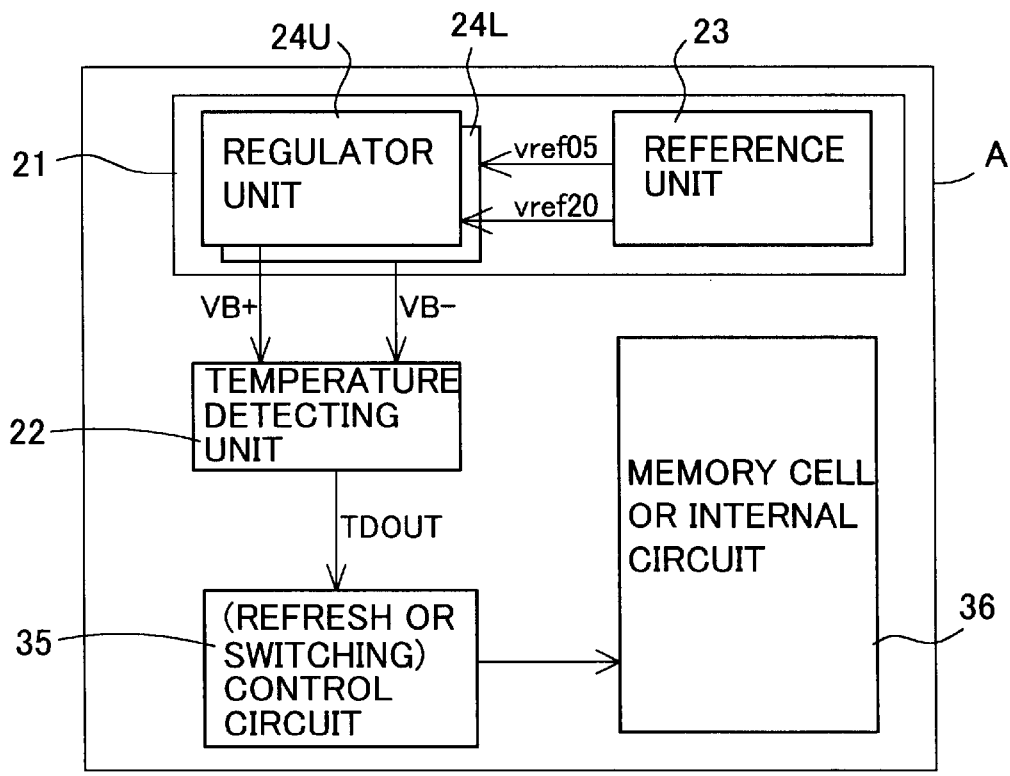
FIG. 5 is a circuit block diagram showing a first modification of the first and second embodiments.

FIG. 5 shows a first modification A of the first and second embodiments. In the constructions of the first and second embodiments, the temperature detecting units 12A and 12B are operated by applying the bias voltage VB+ in the range from the ground potential. Therefore, the bias voltage VB+ demands a voltage output stable for the supply voltage fluctuations or transient noises and needs a slight temperature dependency or a predetermined temperature dependency. On the contrary, the temperature detecting unit 22 of the first modification A is constructed to supply not only the bias voltage VB+ to the positive power supply but also the bias voltage VB- in place of the ground potential to the negative power supply.

The first modification A is provided with, in place of the voltage bias unit 11 having the reference unit 13 and the regulator unit 14 in the first and second embodiments, a voltage bias unit 21 having a reference unit 23 and two sets of regulator units 24U and 24L. Further, the first modification A is provided with a temperature detecting unit 22 in place of the temperature detecting unit 12A or 12B. The first modification A is so constructed as can be applied to either of the first and second embodiments and is provided with a (refresh or switching) control circuit 35 representing the switching control circuit 15 or the refresh control circuit 25, and a memory cell or internal circuit 36 representing the internal circuit 16 or the memory cell 26. Here, the switching control of the internal circuit 36 by the switching control circuit 35 and the refresh control of the memory cell 36 by the refresh control circuit 35 achieve actions/effects similar to those of the first and second embodiments so that their description will be omitted.

The reference unit 23 is powered by either the external supply voltage fed from the outside or the internal drop power supply dropped internally from the external supply voltage, to output reference voltages vref20 and vref05. These two kinds of reference voltages vref20 and vref05 can be generated by the resistance-divided voltage or the like with respect to one reference voltage vref, as will be described hereinafter. Therefore, the differential voltage between the reference voltages has a constant DC voltage difference, and the individual reference voltages vref20 and vref05 have in-phase characteristics with respect to the transient voltage fluctuations so that the constant voltage difference can be kept in a transient response. Moreover, the temperature dependency is also equivalent.

Moreover, the regulator units 24U and 24L output the bias voltage VB+ on the positive supply side and the bias voltage VB- on the negative supply side, respectively, in response to the two kinds of reference voltages vref20 and vref05 input.

Here, the retention of the driving ability by the regulator units 24U and 24L, the construction for retaining the driving ability, and the voltage stabilities of the reference voltages vref20 and vref05 and the bias voltages VB+ and VB- are similar to those of the first and second embodiments so that their description will be omitted.

The temperature detecting unit 22 is fed with the bias voltage VB+ on the positive supply side and the bias voltage VB- on the negative supply side. The differential voltage between the reference voltages vref20 and vref05 have a constant voltage difference in a direct current manner and in a transiently responsive manner. As a result, the differential voltage between the bias voltages VB+ and VB- generated from the reference voltages vref20 and vref05 can be set to a predetermined level having a constant voltage difference in the direct current manner and in the transiently responsive manner but not in dependence upon the temperature. Therefore, the temperature detecting unit 22 is always fed with a constant stable predetermined voltage so that it can detect the predetermined temperature stably. The detected result of the predetermined temperature is outputted as the detected signal TDOUT to the (refresh or switching) control circuit 35. The slight or predetermined temperature dependency, as has been required for the voltage bias unit 11 in the first and second embodiments, can be dispensed with to generate the bias voltages VB+ and VB- more easily.

Here, the measures for stabilizing the bias voltages VB+ and VB- by providing the low-pass filter or the capacitance element or by providing the supply path to supply the bias voltages VB+ and VB- exclusively to the temperature detecting unit 22 can be applied as in the cases of the first and second embodiments.

Figure 6:
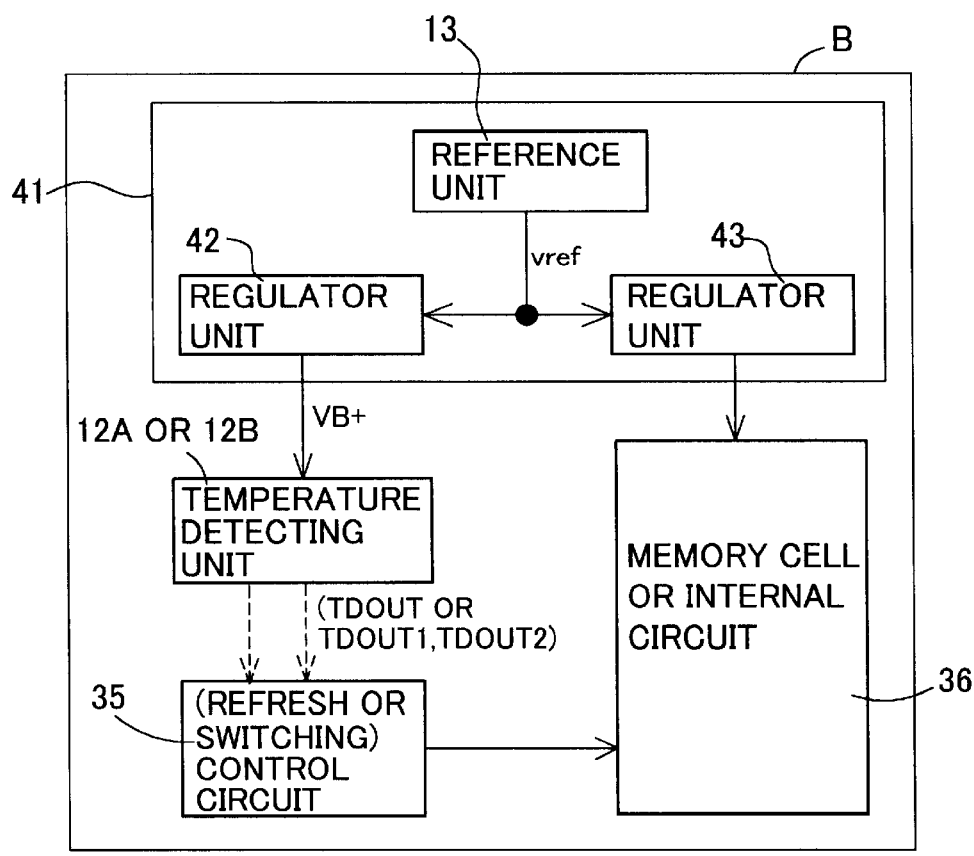
FIG. 6 is a circuit block diagram showing a second modification of the first and second embodiments.

FIG. 6 shows a second modification B of the first and second embodiments. The second modification B is provided with, in place of the voltage bias unit 11 in the first and second embodiments having the reference unit 13 and the regulator unit 14, a voltage bias unit 41 having the reference unit 13 and two sets of regulator units 42 and 43.

The second modification B is provided with the regulator unit 42 which is separated from and made independent of the regulator unit 43 for feeding the bias voltage to the memory cell or the internal circuit 36, thereby to feed the bias voltage VB+ exclusively to the temperature detecting unit 12A or 12B. As a result, there is no fear for the transient noises, as caused by the actions of the memory cell or the internal circuit 36, to migrate into the bias voltage VB+ to the temperature detecting unit 12A or 12B, so that the stable bias voltage VB+ can be applied. Here, the regulator unit 42 has a construction similar to that of the regulator unit 14. Moreover, the construction can also be made by providing the regulator units 24U and 24L and the temperature detecting unit 22 in place of the regulator unit 42 and the temperature detecting units 12A and 12B.

The remaining construction and actions/effects are similar to those of the first and second embodiments so that their description will be omitted.

Here will be described specific examples of the individual components in the first and second embodiments and in the first and second modifications.

Figure 7:
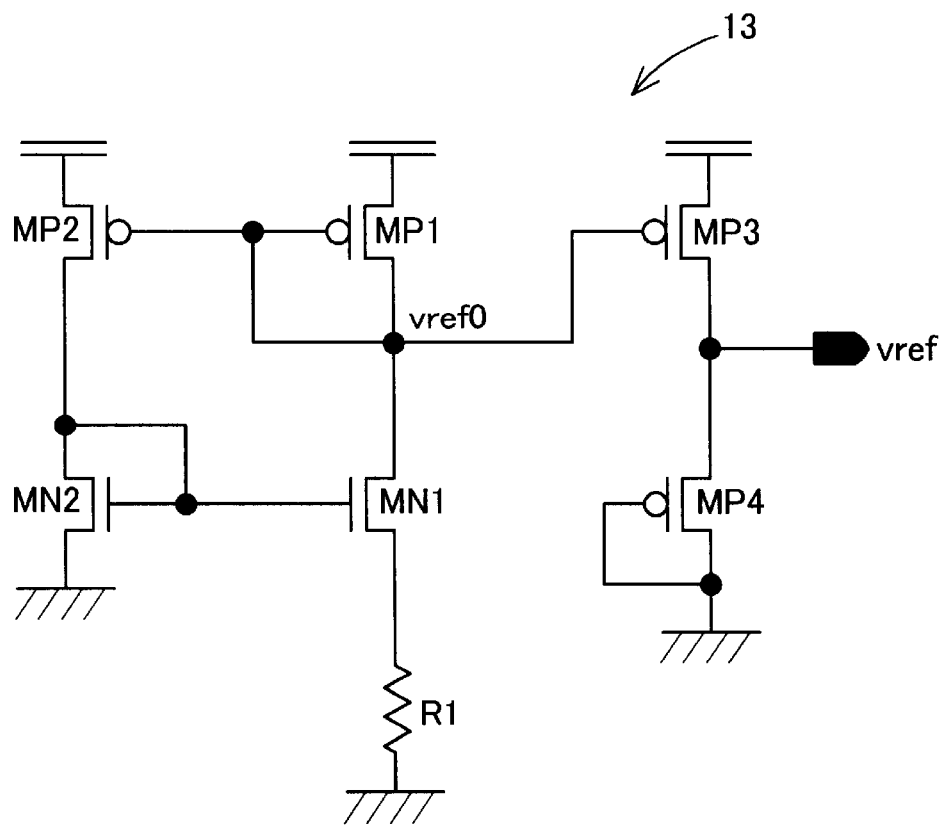
FIG. 7 is a circuit diagram showing a specific example of a reference unit.

In a specific example of the reference unit 13 shown in FIG. 7, with a first current mirror circuit which is composed of an NMOS transistor MN1 having a current adjusting resistance element R1 connected between the ground potential and a source terminal and a diode-connected NMOS transistor MN2, there is connected a second current mirror circuit which is composed of PMOS transistors MP1 and MP2 connected to have a feedback current. The bias current determined by that feedback line flows from another PMOS transistor MP3 composing the second current mirror circuit to a diode-connected PMOS transistor MP4, so that the reference voltage vref is outputted from node.

Figure 8:
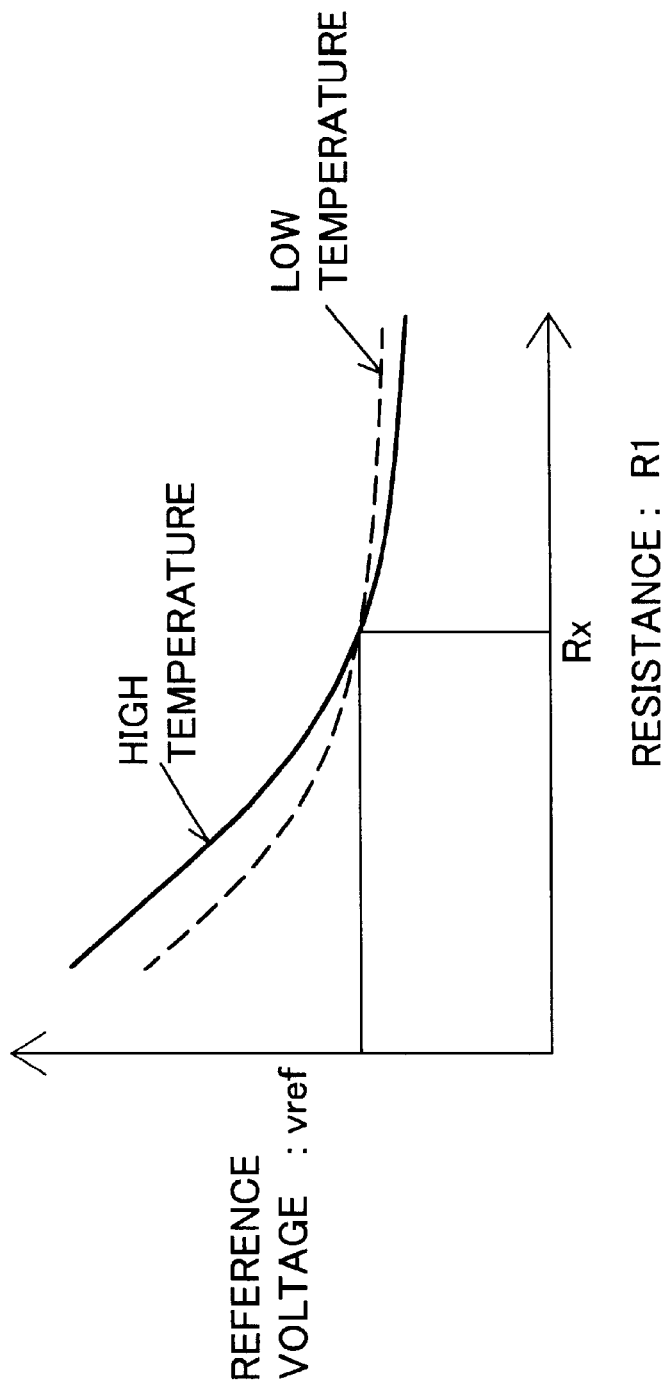
FIG. 8 is a characteristic diagram illustrating output characteristics of the specific example of the reference unit.

In the reference unit 13 of FIG. 7, the current mirror ratio of the first current mirror circuit changes with the resistance of the resistance element R1 to adjust the bias current value so that the reference voltage vref changes. Due to the difference in the temperature dependency such as the device characteristics of the PMOS/NMOS transistors, moreover, there is exhibited a different temperature dependency according to the bias current value. These characteristics are illustrated in FIG. 8. There exists the bias current value at which the temperature dependency between the devices is balanced to offset the temperature dependency of the reference voltage vref. Then, the resistance element R1 has a resistance of R1=Rx.

On the lower resistance side than R1=Rx (or on the side for a higher bias current), the reference voltage vref has a relatively large value with respect to the resistance R1 and a positive dependency with respect to the temperature, which is preferred for warranting the action characteristics at the ends (i.e., the minimum: tmin and the maximum: tmax) of the working temperature range. In the semiconductor device 1 or the semiconductor memory 2, more specifically, the bias voltage of the various internal circuits is generated on the basis of the reference voltage vref. The reference voltage vref drops in the lower temperature region to provide an effect to reduce the consumed current IDD, and the reference voltage vref can rise in the higher temperature region to improve the action speed tACCESS. Therefore, it is general to employ that temperature characteristic region as the ordinary bias voltage.

On the higher resistance side than R1=Rx (or on the side for a lower bias current), on the other hand, the temperature dependency of the reference voltage vref on the temperature is inverted, but the dependency on the resistance R1 becomes small so that a relatively constant voltage can be obtained even with the dispersion of the resistance element R1. The temperature dependencies in the device characteristics of the PMOS/NMOS transistors are suitably adjusted to suppress the temperature dependency in the bias current region so that the reference voltage vref having a slight constant temperature dependency can be outputted.

In the case where a predetermined temperature to be detected deviates in a direction to a margin temperature with respect to the temperature region for switching the action state or the refresh period even in the temperature dependency in either the lower or higher resistance side than R=Rx, moreover, the reference voltage vref can be outputted as a voltage having a predetermined temperature dependency. In the switching of the refresh period in which the data holding characteristics on the higher temperature side are rate-determinant, for a specific example, the deviation is oriented in the margin temperature direction (as referred to FIG. 4) if the temperature to be switched deviates to the lower temperature side. If the region on the lower resistance side or on the higher resistance side than R1=Rx is selected by a combination with the circuit construction of the temperature detecting units 12A and 12B, a stable switching action can be realized for the dispersion of the temperature characteristics.

Figure 9:
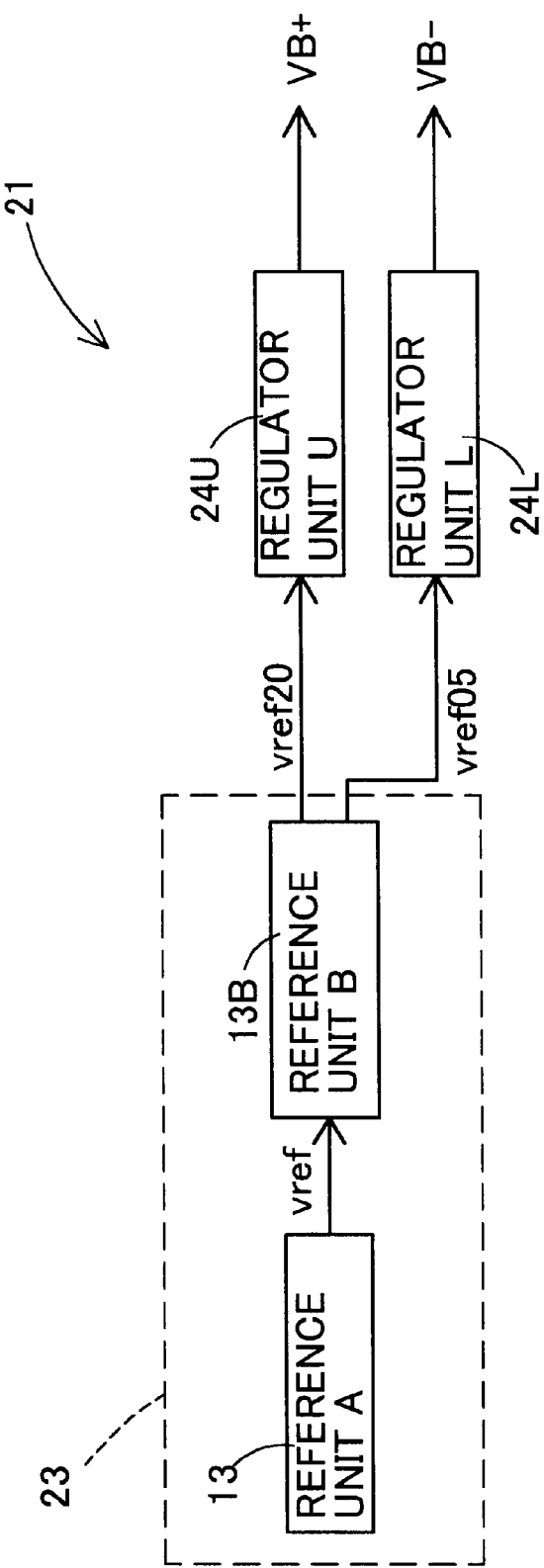
FIG. 9 is a circuit block diagram showing a specific example of a voltage bias unit in the first modification.

In a specific example of the voltage bias unit 21 shown in FIG. 9, the reference unit 23 for generating two kinds of reference voltages vref20 and vref05 from the reference voltage vref coming from the reference unit A (13) is constructed by using the specific example of FIG. 7 as a reference unit A (13) and by further including a reference unit B (13B). The reference voltages vref20 and vref05 are fed to regulator units U/L (24U/24L), respectively, so that the two kinds of bias voltages VB+ and VB− are generated.

Figure 10:
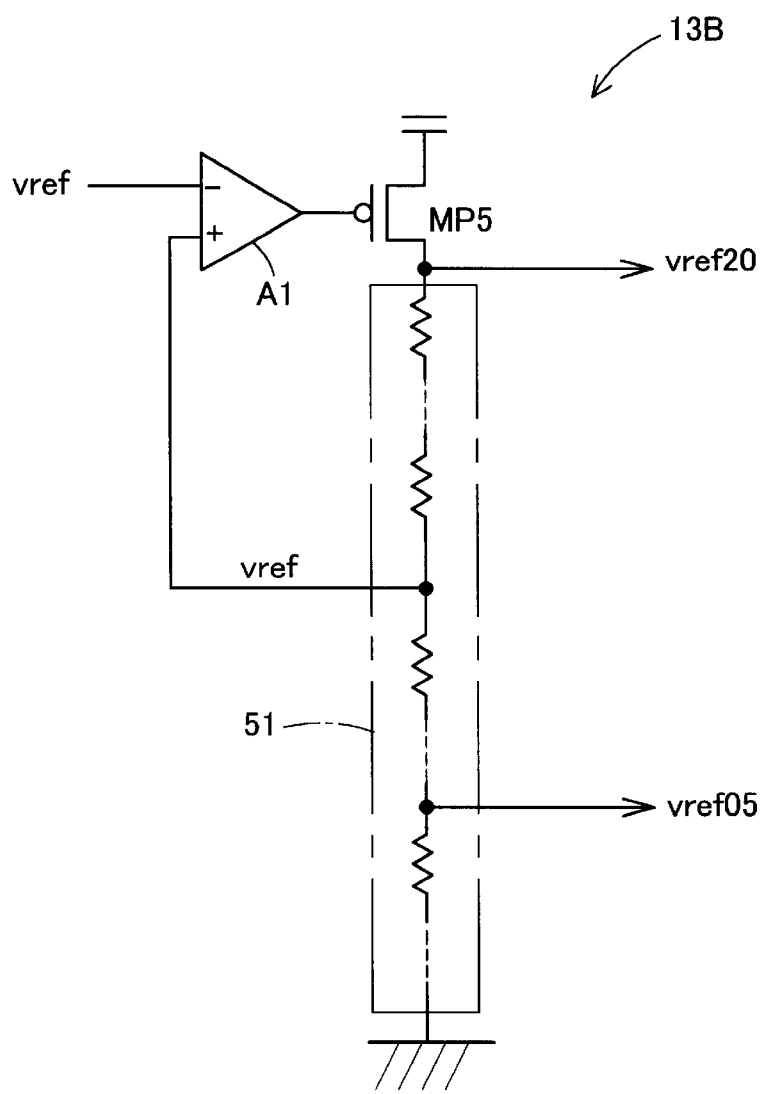
FIG. 10 is a circuit diagram showing a specific example of the reference unit in the first modification.

In a specific example of the reference unit B (13B) shown in FIG. 10, a resistance element row 51 having a plurality of resistance elements is connected with the voltage source through a PMOS transistor MP5. In this construction, the gate terminal of the PMOS transistor MP5 is so controlled by an amplifier A1 that the predetermined position of the resistance element row 51 may be controlled to the reference voltage vref. By controlling the predetermined position of the resistance element row 51 to the reference voltage vref, the two kinds of reference voltages vref20 and vref05 can be outputted from a suitable position of the resistance element row 51.

Figure 11:
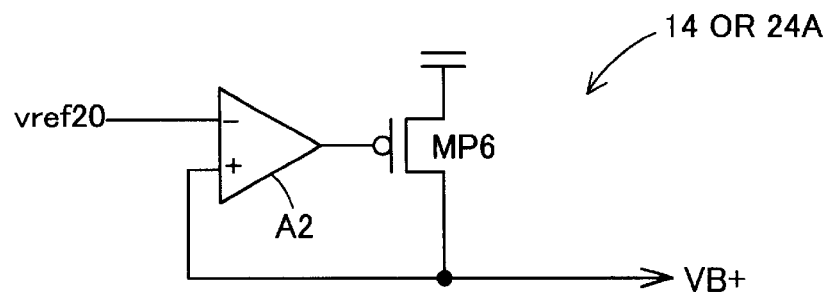
FIG. 11 is a circuit diagram showing a specific example of a regulator unit for outputting a bias voltage VB+.
Figure 12:
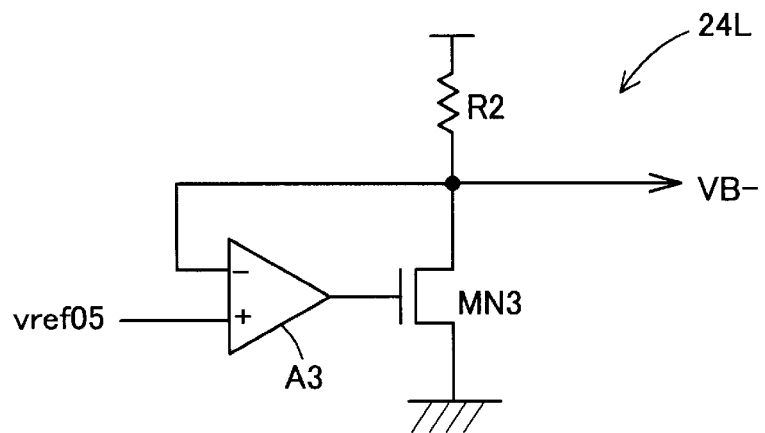
FIG. 12 is a circuit diagram showing a specific example of the regulator unit for outputting a bias voltage VB−.

FIGS. 11 and 12 show specific examples of the regulator unit U (24U) and the regulator unit L (24L), respectively. Moreover, FIG. 11 also shows a specific example of the regulator unit 14. In FIG. 11, the bias voltage VB+ at the same level as that of the reference voltage vref20 is output by controlling a PMOS transistor MP6 connected with the voltage source by an amplifier A2. In FIG. 12, the bias voltage VB− at the same level as that of the reference voltage vref05 is output by controlling an NMOS transistor MN3 connected with the voltage source through the resistance element R2 by an amplifier A3. Both the regulator units are buffer circuits for intensifying the driving ability while keeping the voltage levels of the reference voltages vref20 and vref05.

Figure 13:
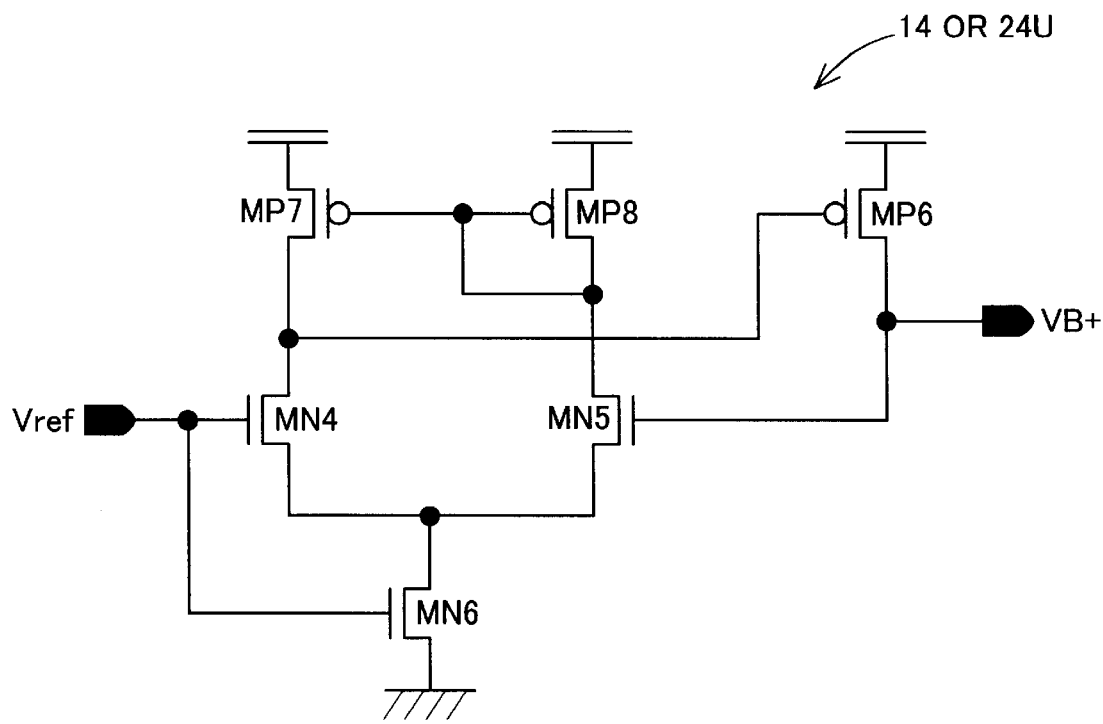
FIG. 13 is a circuit diagram showing a specific example of the regulator unit of FIG. 11 with transistor levels.

FIG. 13 schematically shows the circuit construction of the amplifier A2 for the regulator units 14 and 24U of FIG. 11. A differential input state for NMOS transistors MN4 and MN5 is constructed to include an active load composed of PMOS transistors MP7 and MP8. Moreover, the bias current is fed by an NMOS transistor MN6 which has its gate terminal biased with the reference voltage vref.

Figure 14:
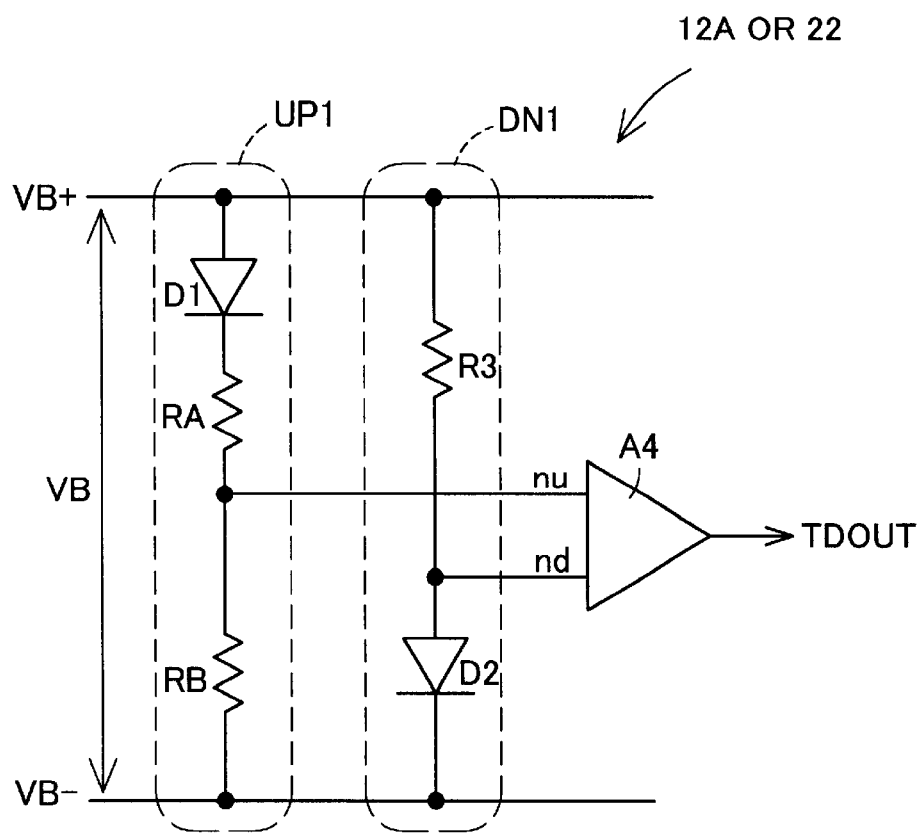
FIG. 14 is a circuit diagram showing a specific example of a temperature detecting unit.

FIG. 14 shows the temperature detecting unit 12A or 22. This temperature detecting unit is provided, in a direction from the bias voltage VB+ on the positive supply side to the bias voltage VB− on the negative supply side, with: a positive temperature characteristic unit UP1 for connecting a diode element D1 and resistance elements RA and RB; and a negative temperature characteristic unit DN1 for connecting a resistance element R3 and a diode element D2. From between the resistance elements RA and RB of the positive temperature characteristic unit UP1 and between the resistance element R3 and the diode element D2 of the negative temperature characteristic unit DN1, respectively, terminals nu and nd having a positive temperature characteristic voltage Vnu and a negative temperature characteristic voltage Vnd are connected with the input terminals of a comparator A4. From this comparator A4, moreover, there is outputted the detected signal TDOUT of the temperature. Here, the bias voltage VB− for the temperature detecting unit 12A is at the ground potential, and the bias voltage VB− for the temperature detecting unit 22 is the bias voltage VB− from the regulator unit 24L. In either case, the voltage difference VB is applied as the output voltage of the positive temperature characteristic unit UP1 and the negative temperature characteristic unit DN1.

Here, the temperature detecting unit such as the temperature detecting unit 12B for detecting two kinds or more temperatures can be constructed by including a positive temperature characteristic unit having an output from a suitable voltage dividing position, as obtained by further dividing resistance elements RA and RB, and a comparator in accordance with the number of temperatures to be detected.

Figure 15:
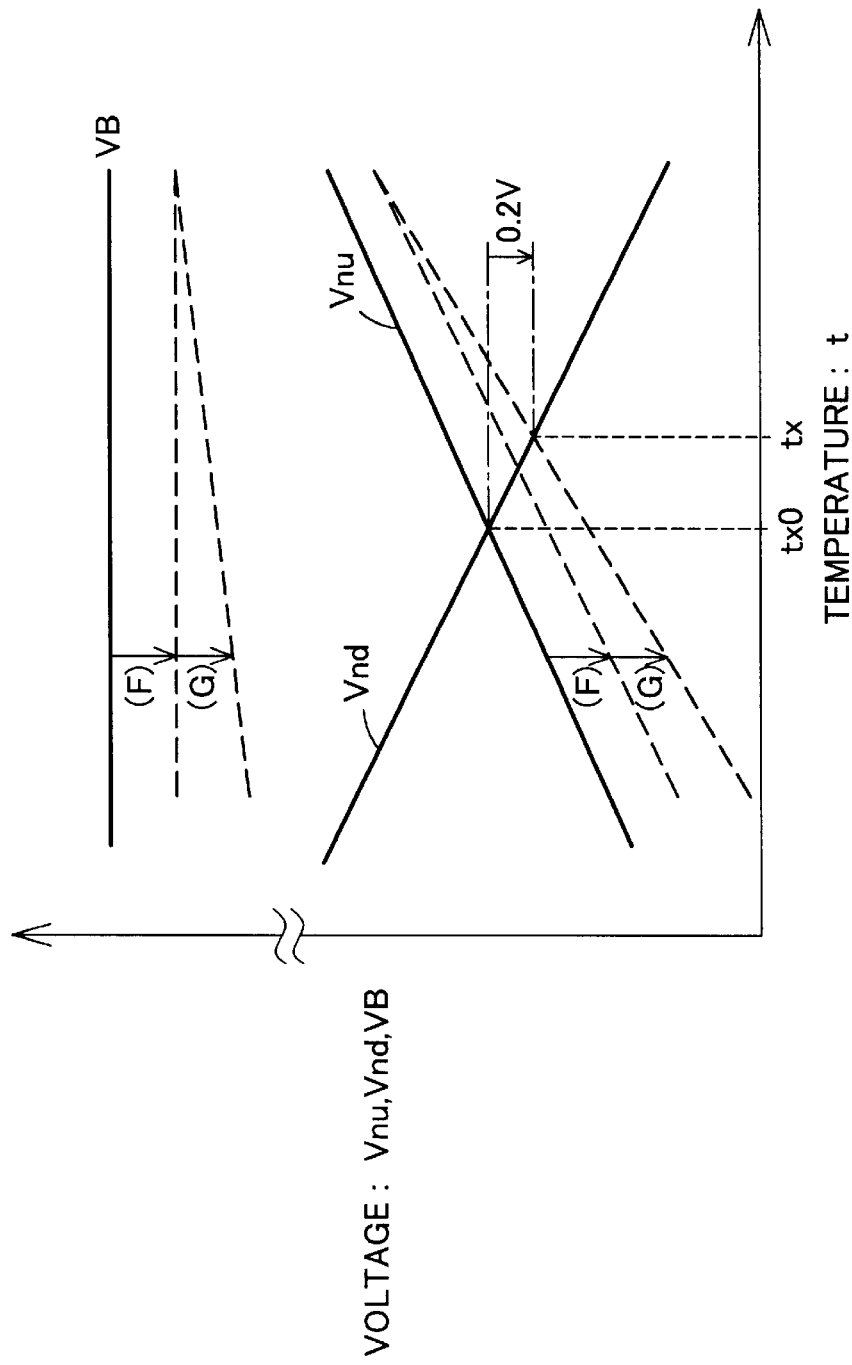
FIG. 15 is a characteristic diagram illustrating temperature characteristics of a specific example of the temperature detecting unit.

As illustrated in FIG. 15, the positive temperature characteristic voltage Vnu is obtained by dividing the voltage, as dropped by a forward voltage VF of the diode D1 from the bias voltage VB+ of the positive power supply, with the resistance elements RA and RB. The negative temperature characteristic voltage Vnd is obtained by raising the voltage, as raised by the forward voltage VF of the diode D2 from the bias voltage VB− of the negative power supply. Here, the forward voltage VF has temperature characteristics of −2 mV/°C.

The positive temperature characteristic voltage Vnu, as set by the drop of the forward voltage VF from the bias voltage VB+, exhibits the positive temperature characteristics which are determined by dividing the temperature characteristics of 2 mV/°C. with the resistance elements RA and RB. On the other hand, the negative temperature characteristic voltage Vnd, as set by the rise of the forward voltage VF from the bias voltage VB−, has the negative temperature characteristics of −2 mV/°C. By suitably adjusting the resistance ratio between the resistance elements RA and RB, the voltages Vnu and Vnd are enabled to cross at a predetermined temperature. With (VB+)−(VB−)=2V and VF=0.7 V at the predetermined temperature tx0, for numerical examples, the resistance ratio between the resistance elements RA and RB may be set at RA:RB=6:7.

Here in the first modification A, the bias voltages VB+ and VB− are fed as signals in phase so that the characteristics of FIG. 15 is hardly influenced with respect to the dispersion of the voltage values. In the case where the bias voltage VB− is at the ground potential (e.g., in the cases of the semiconductor device 1 of the first embodiment and the semiconductor memory 2 of the second embodiment), moreover, the negative temperature characteristic voltage Vnd is set by the rise of the forward voltage VF of the diode D2 so that it is not influenced by the dispersion of the bias voltage VB+ from the voltage bias unit 11. On the contrary, the positive temperature characteristic voltage Vnu is set by the drop in the forward voltage VF from the bias voltage VB+. Therefore, the bias voltage VB+ has to be stably fed with a slight or predetermined temperature dependency from the voltage bias unit 11 or 41.

Let it be assumed that the bias voltage VB+ disperses. If it is assumed that the bias voltage VB− is at the ground potential and has no dispersion, the dispersion of the bias voltage VB+ is that of the voltage difference VB between the positive/negative temperature characteristic units UP1/DN1. In accordance with the dispersion of the bias voltage VB+ to the negative voltage side, the voltage difference VB also disperses to the negative voltage side, and the positive temperature characteristic voltage Vnu also disperses to the negative voltage side (at (F) in FIG. 15). If the bias voltage VB+ has positive temperature characteristics, moreover, the voltage difference VB accordingly has the positive temperature characteristics, and similar temperature characteristics also appear in the voltage Vnu (at (G) in FIG. 15). If the temperature characteristics are thought with reference to the higher temperature region, they have a large dispersion on the lower temperature side.

By this dispersion, the temperature tx, at which the voltages Vnu and Vnd cross, is shifted to the higher temperature side from the predetermined temperature tx0. In the switching control of the refresh period tREF of the semiconductor memory 2, the longer refresh period tREF is extended to the higher temperature side to deteriorate the data holding characteristics of the memory cell 26. Depending upon the setting conditions, the refresh period tREF may become longer than the data holding time tST, and the data may disappear (at (E) in FIG. 4).

This dispersion will be exemplified by specific numerical values. From FIG. 14 where RA:RB=6:7 is satisfied, the voltages Vnu and Vnd satisfy the following expressions.

$$Vnu = (RB/(RA+RB)) \times (VB - VF) \qquad (1),$$

$$= (7/13) \times (VB - VF)$$

and $$Vnd = VF \qquad (2).$$

If a dispersion of −0.2 V occurs for VB=2 V, Formula (1) is rewritten into:

$$Vnu = (7/13) \times (2 - 0.2 - VF) \qquad (3).$$

From Formulas (2) and (3), the crossing voltage of the voltages Vnu and Vnd is expressed by:

$$(7/13) \times (2 - 0.2 - VF) = VF$$

$$VF = (1.8 \times 7)/20 = 0.63 \qquad (4).$$

It is assumed that VF=0.7 V at the predetermined temperature tx0. Therefore, the dispersion of the predetermined temperature tx is determined by the temperature characteristics (−2 mV/° C.) of VF, as follows:

$$\Delta tx = tx - tx0 = (630 - 700)/(-2) = 35° \text{ C.}$$

For the setting of tx0=50° C., as exemplified in FIG. 4, tx=85° C., and the setting is not sufficient for tmax=90° C.

The dispersion of the predetermined temperature to be detected is suppressed or the dispersion of the temperature direction to the margin switching in the internal actions thus far described. Therefore, the temperature detection can be ensured by setting the resistance of the resistance element R1 in the reference unit 13 of FIG. 7 thereby to set the characteristic region (as referred to FIG. 8) having a slight or predetermined temperature dependency.

Figure 16:
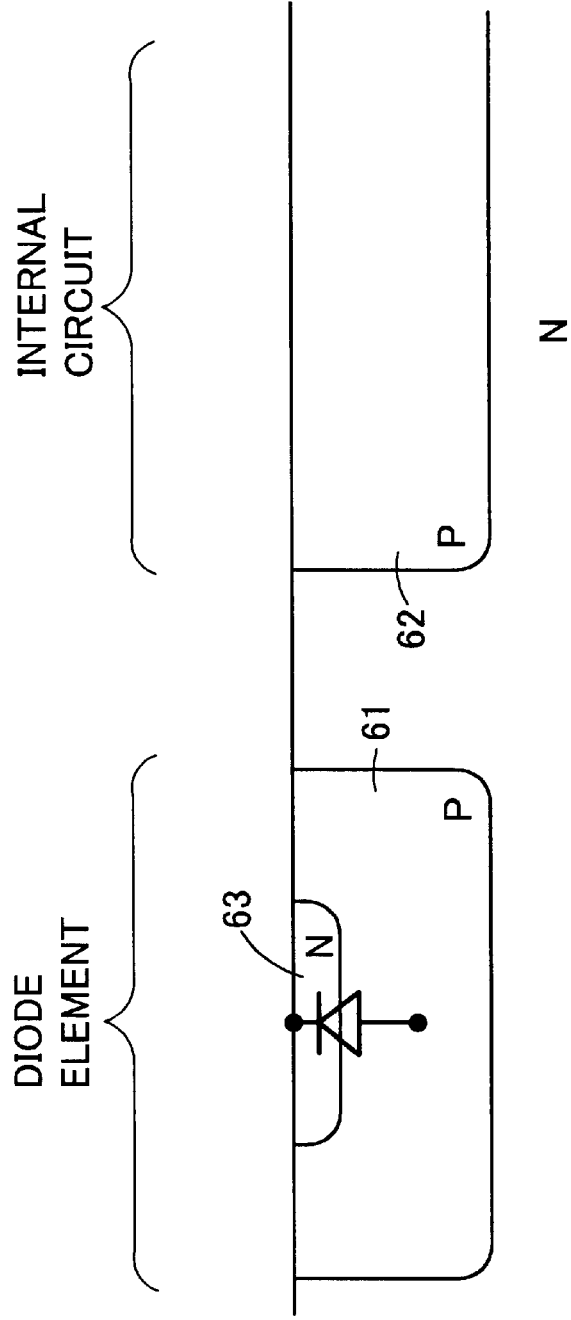
FIG. 16 is a structural diagram showing a first specific example of a diode structure of the temperature detecting unit.
Figure 17:
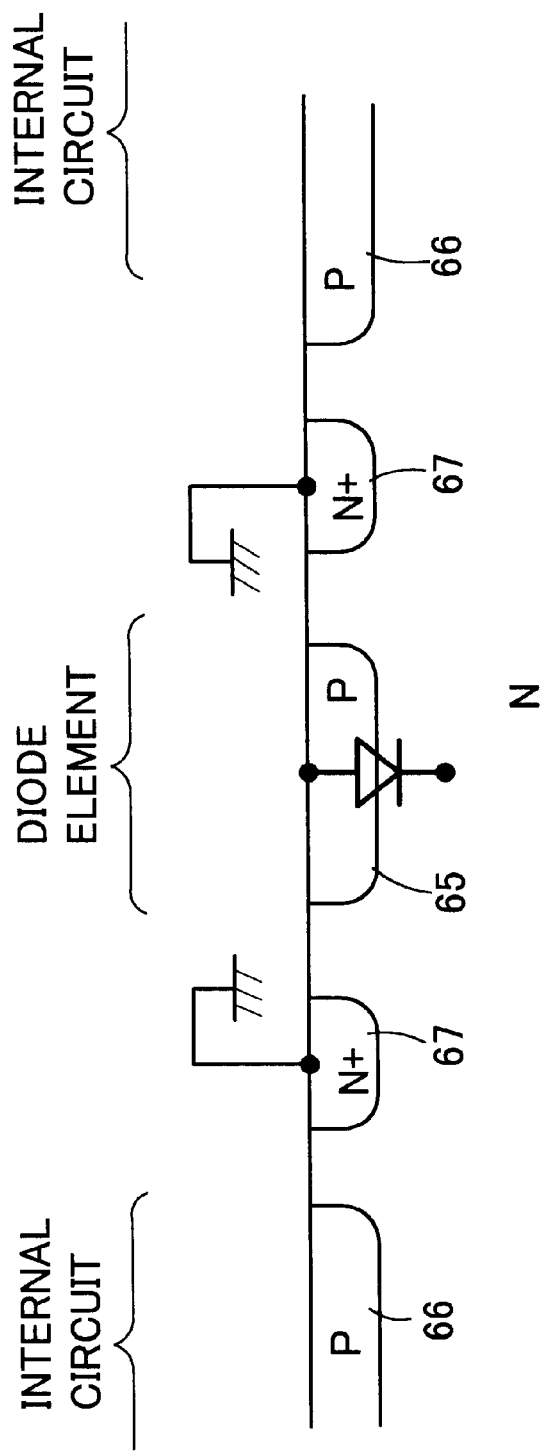
FIG. 17 is a structural diagram showing a second specific example of the diode structure of the temperature detecting unit.

In FIGS. 16 and 17, here are shown first and second specific examples of the case in which the diode elements D1 and D2 in the temperature detecting unit 12A or 22 of FIG. 14 are constructed of the semiconductor device 1, the semiconductor memory 2 or the like. In the first and second specific examples, the construction is exemplified over an N-type substrate.

In the first specific example of FIG. 16, the diode electrodes D1 and D2 are formed of a deep diffusion layer and a shallow diffusion layer. Of P-type well layers 61, 62 and so on to be used in a CMOS device element or the like, the P-type well layer 61 separated from the P-type well layer 62 in which an internal circuit is arranged is employed by the deep diffusion layer for constructing anode terminals. The cathode terminals employ an N-type diffusion layer 63 or the like of the source/drain layer of the CMOS device element to be formed in the P-type well layer 61. The P-type well layer 61 separated from and independent of the P-type well layer 62 forming the internal circuits is employed so that the sneak of the noises from the internal circuit can be suppressed to construct the stable positive temperature characteristic portion UP1 and negative temperature characteristic portion DN1. Here, the diode electrodes D1 and D2 can be likewise constructed in the case where the conduction types of the individual conductive layers are inversed.

The second specific example of FIG. 17 exemplifies the forming case over the N-type substrate. The diode elements D1 and D2 are formed of the N-type substrate and a P-type diffusion layer. The N-type substrate can be employed as a cathode terminal, and an anode terminal can employ a P-type diffusion layer 65 or the like forming the source/drain layers of the CMOS device element. In order to suppress the influence of the noises from a P-type diffusion layer 66 constructing an adjoining internal circuit, an N+-type diffusion layer 67 is arranged between the P-type diffusion layer 66 and the P-type diffusion layer 65 with being surrounded by the P-type diffusion layer 66. The N+-type diffusion layer 67 is biased as the biasing terminal of the N-type substrate by the ground potential or the like. By absorbing the substrate current from the peripheral circuit, a function to feed a stable bias to the cathode terminals of the diode elements is given to provide a shield structure from the peripheral circuit. Here, the diode elements can also be constructed in the case where the conduction type of the individual semiconductor layers are inverted.

Here, the diode elements D1 and D2 can also be replaced by diode-connected bipolar elements or diode-connected MOS transistor elements.

Next, the effects to be exerted on the temperature detecting unit 12A or 22 of the case in which the predetermined voltage VB outputted from the voltage bias unit 11, 21 or 41 has a predetermined temperature dependency will be described with reference to FIGS. 18 and 19.

Figure 18:
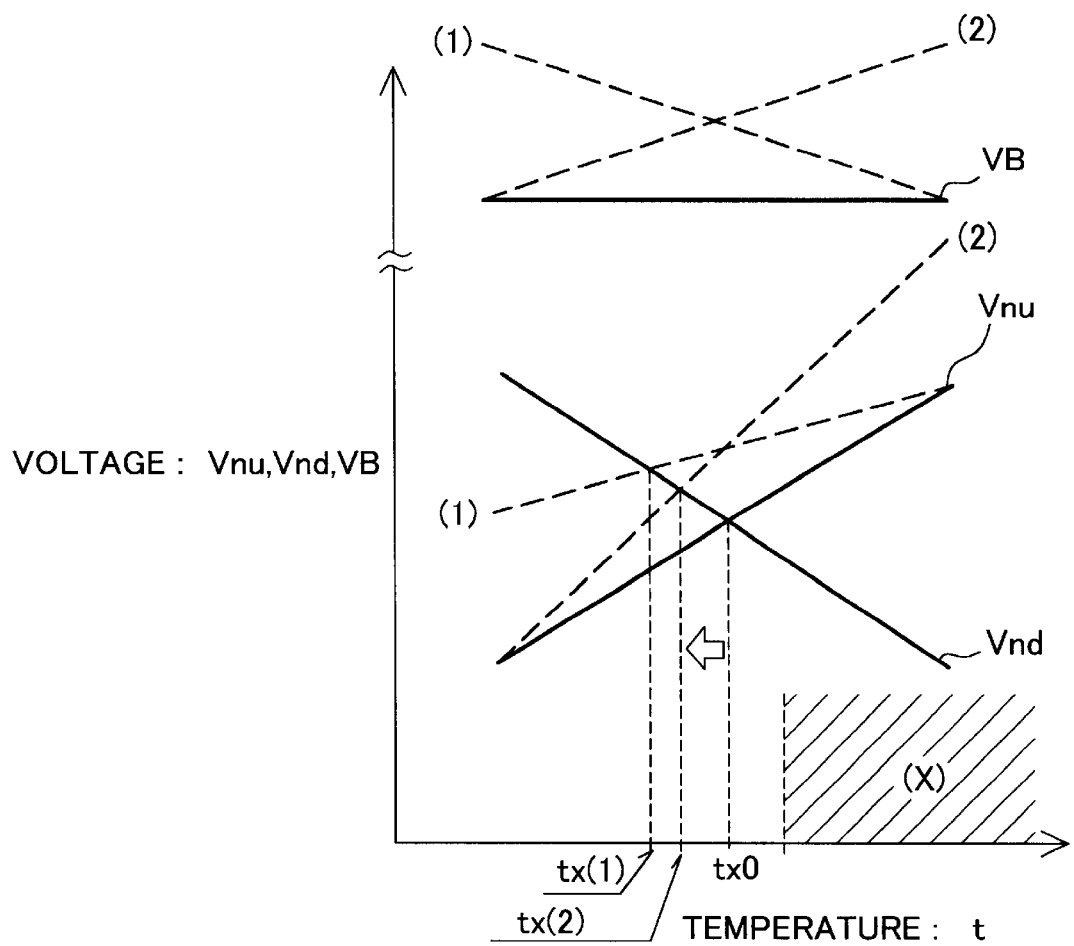
FIG. 18 is a characteristic diagram (for state change on a higher temperature side than a temperature to be detected) illustrating a predetermined temperature dependency in a bias voltage to be applied to the temperature detecting unit.

FIG. 18 illustrates the case in which the action state of the semiconductor device 1, the semiconductor memory 2 or the like is to be changed in the higher temperature region (X) (at (X) in FIG. 18) than the predetermined temperature tx0 to be detected. In the temperature region, the refresh period tREF is to be set short in the semiconductor memory 2, for example.

Two temperature dependencies are considered in this case. In the first case, the voltage value of the predetermined voltage VB is set to voltage and the negative temperature characteristics with reference to the set predetermined voltage VB in the higher temperature region are used as a predetermined temperature dependency. By this temperature dependency, the positive temperature characteristic voltage Vnu of the temperature detecting unit 12A or 22 is characterized (at (1) in FIG. 18) to have a higher voltage value than that of the lower temperature region with reference to the higher temperature region. As a result, the temperature tx(1) to be detected is shifted to the lower temperature side than the predetermined temperature tx0 in the temperature direction margin for the region (X) to change the action stage.

In the second case, the voltage value of the predetermined voltage VB is set to voltage and the positive temperature characteristics with reference to the set predetermined voltage VB in the lower temperature region are used as a predetermined temperature dependency. In this case, the positive temperature characteristic voltage Vnu is characterized (at (2) in FIG. 18) to have a higher voltage value than that of the higher temperature region with reference to the lower temperature region. As a result, the temperature tx(2) to be detected is shifted to the lower temperature side than the predetermined temperature tx0 in the temperature direction margin for the region (X).

If the dispersion of the temperature dependency of the predetermined voltage VB to be output from the voltage bias unit 11, 21 or 41 is within the range of the predetermined temperature dependency, therefore, the temperature to be detected does not bite into the region (X) having the action state to be changed, so that the switching action by the temperature detection can be stabilized.

Figure 19:
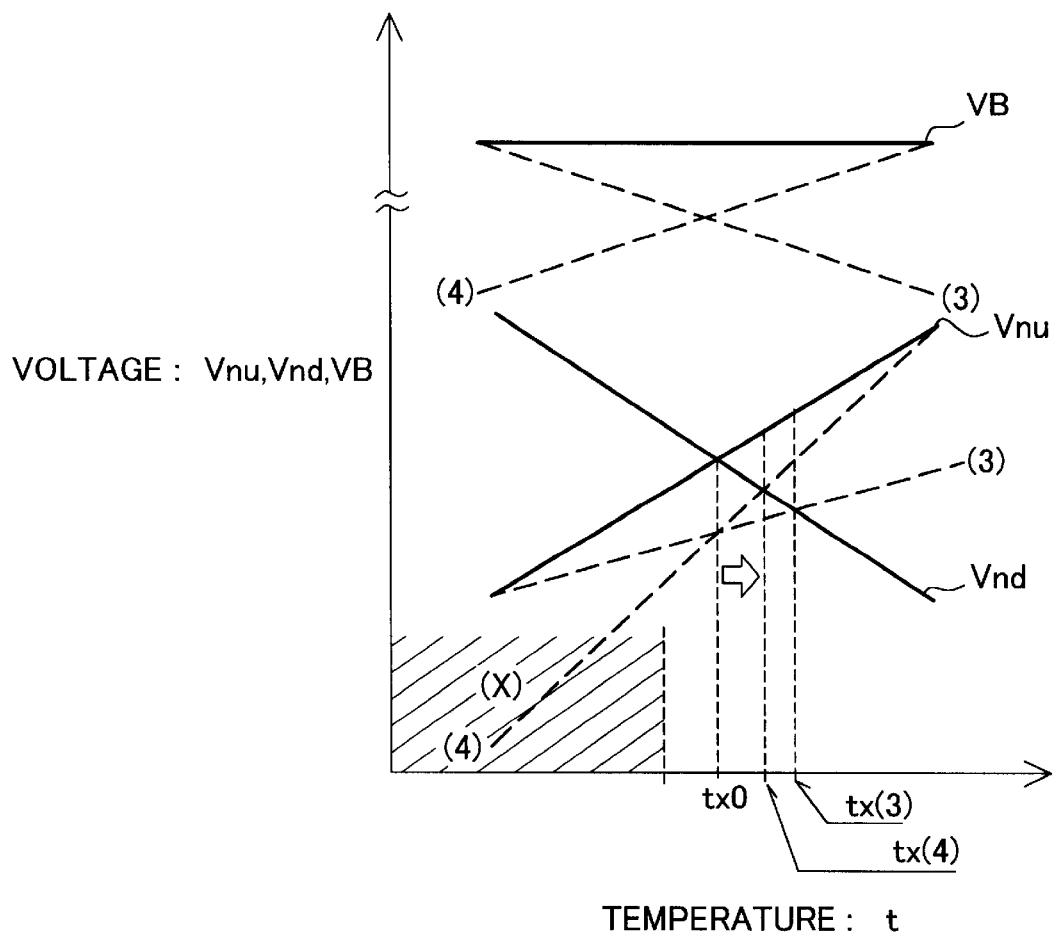
FIG. 19 is a characteristic diagram (for state change on a lower temperature side than a temperature to be detected) illustrating a predetermined temperature dependency in the bias voltage to be applied to the temperature detecting unit.

FIG. 19 illustrates the case in which the region (X) (at (X) in FIG. 19) having the action state to be changed is in the lower temperature region than the predetermined temperature tx0 to be detected. In this case, actions/effects similar to those of the case of FIG. 18 can be attained by setting the voltage value of the predetermined voltage VB to make the negative temperature characteristics into the predetermined temperature dependency with reference to the voltage set in the lower temperature region (at (3) in FIG. 19) or by setting the voltage value of the predetermined voltage VB to make the positive temperature characteristics into the predetermined temperature dependency with reference to the voltage set in the higher temperature region (at (4) in FIG. 19).

Moreover, the construction can also be modified so that the diodes D1 and D2 having the negative temperature characteristics of FIG. 14 can be replaced by a voltage dropping unit having positive temperature characteristics. In this case, too, similar actions/effects can be obtained if the predetermined voltage VB is given a predetermined temperature dependency similar to those of FIGS. 18 and 19. Here, an active load or the like by MOS transistors can be conceived as an example of the voltage dropping unit having the positive temperature characteristics.

Figure 20:
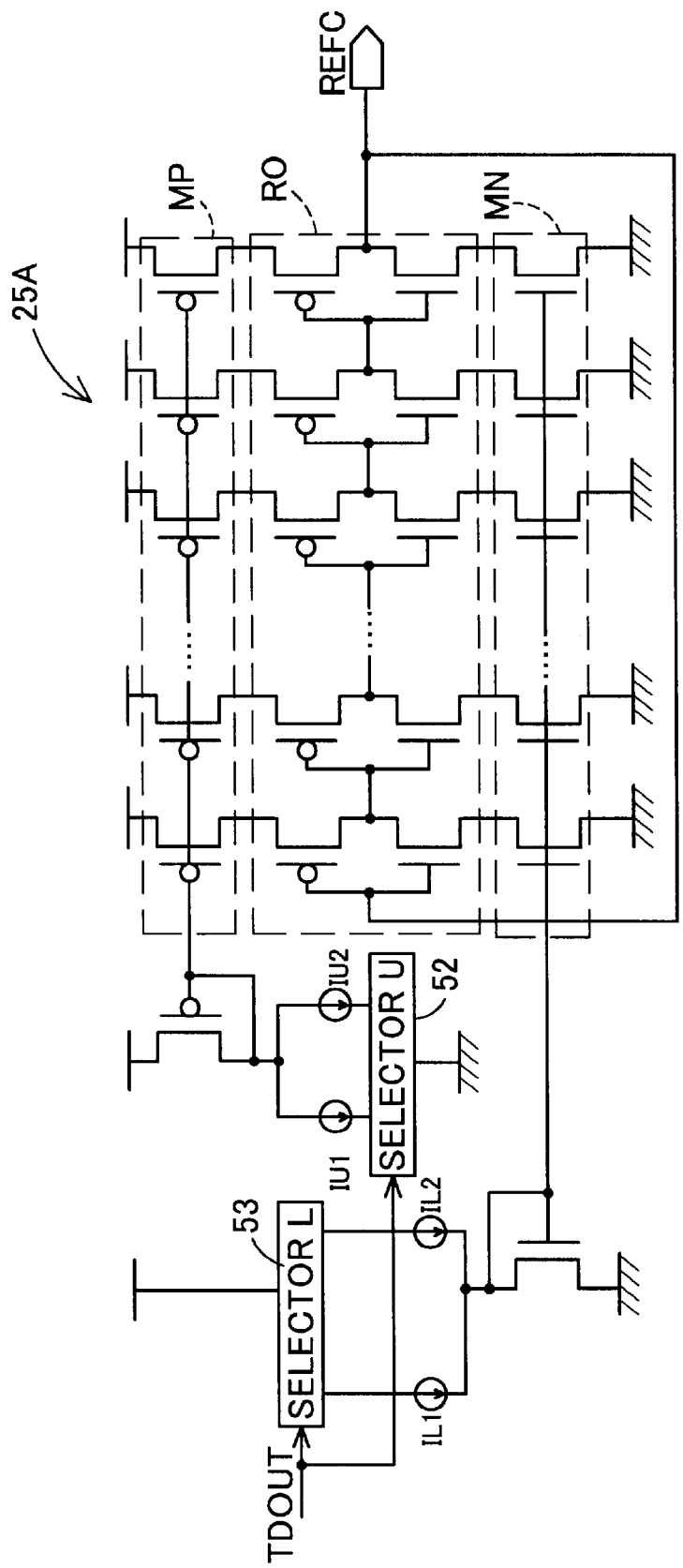
FIG. 20 is a circuit diagram showing a first specific example of a refresh control circuit.

Next, specific examples of the refresh control circuit 25 are shown in FIGS. 20 to 23. FIG. 20 shows a first specific example. In this construction, a control signal REFC is outputted to the memory cell 26 from an oscillation circuit portion RO in which odd stages of inverter logic gates are connected in a loop shape.

The source terminals of the PMOS transistors and the NMOS transistors of the individual inverter logic gates of the oscillation circuit portion RO are connected through the PMOS transistors (or the component transistors of the MP) and the NMOS transistors (or the component transistors of the MN), respectively, with the supply voltage and the ground potential, to specify the drive currents of the individual inverter logic gates of the oscillation circuit portion RO. The drive current is generated by selecting current sources IU1 and IU2 and IL1 and IL2 of different current values with selectors 52 and 53 controlled in response to the detected signal TDOUT from the temperature detecting unit 12A or 22. In the inverter logic gate, the propagation delay time is controlled according to the drive current to control the switching of the refresh period tREF.

Figure 21:
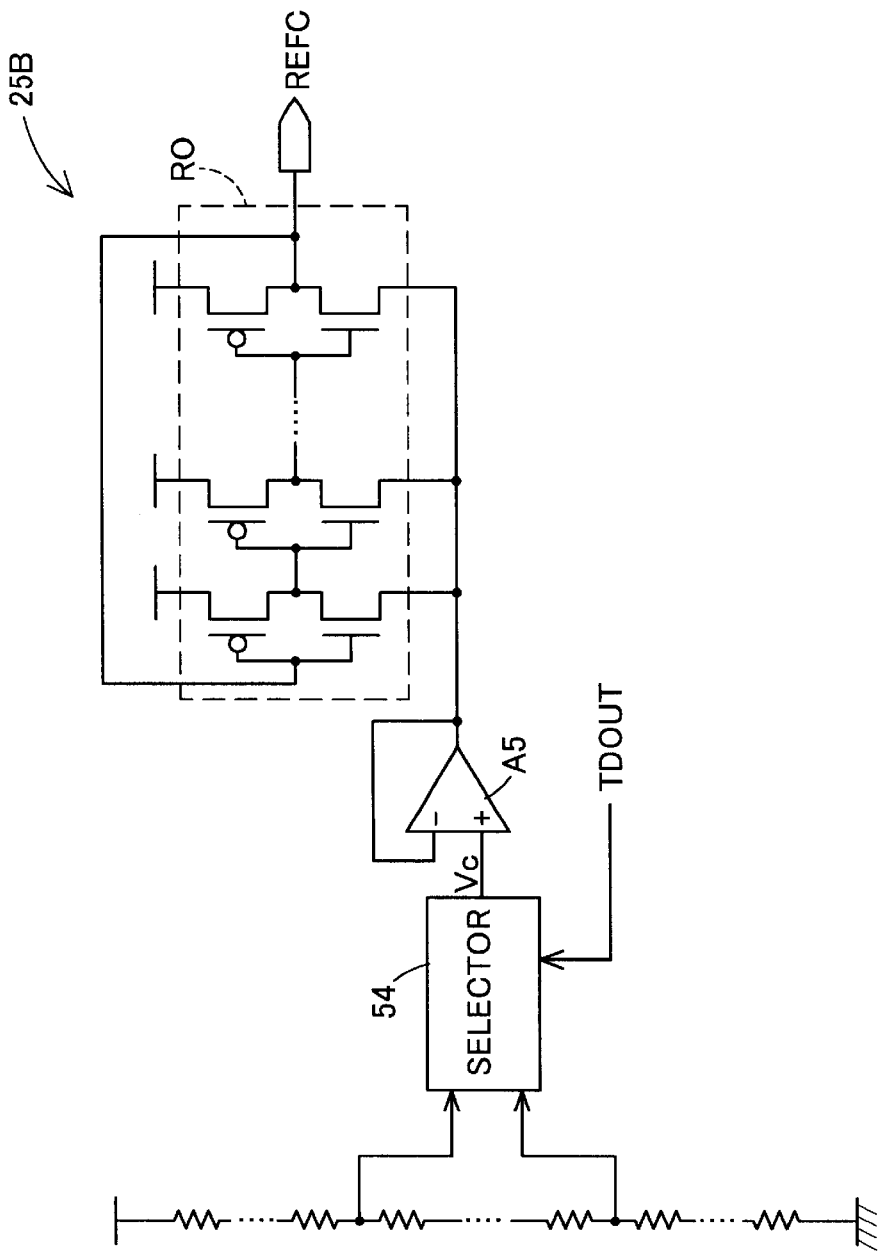
FIG. 21 is a circuit diagram showing a second specific example of the refresh control circuit.

FIG. 21 shows a second specific example. The oscillation circuit portion RO has the same construction as that of the first specific example of FIG. 20. In the second specific example, the control of the driving ability of the oscillation period is realized by controlling the supply voltage. A control voltage Vc is selected by a selector 54, which is controlled in response to the detected signal TDOUT from the temperature detecting unit 12A or 22, and is connected with the lower voltage side terminal of the oscillation circuit portion RO through a buffer circuit A5. The refresh period tREF is controlled by controlling the voltage value of the lower voltage side terminal of the oscillation circuit portion RO thereby to make the driving supply voltage variable.

Figure 22:
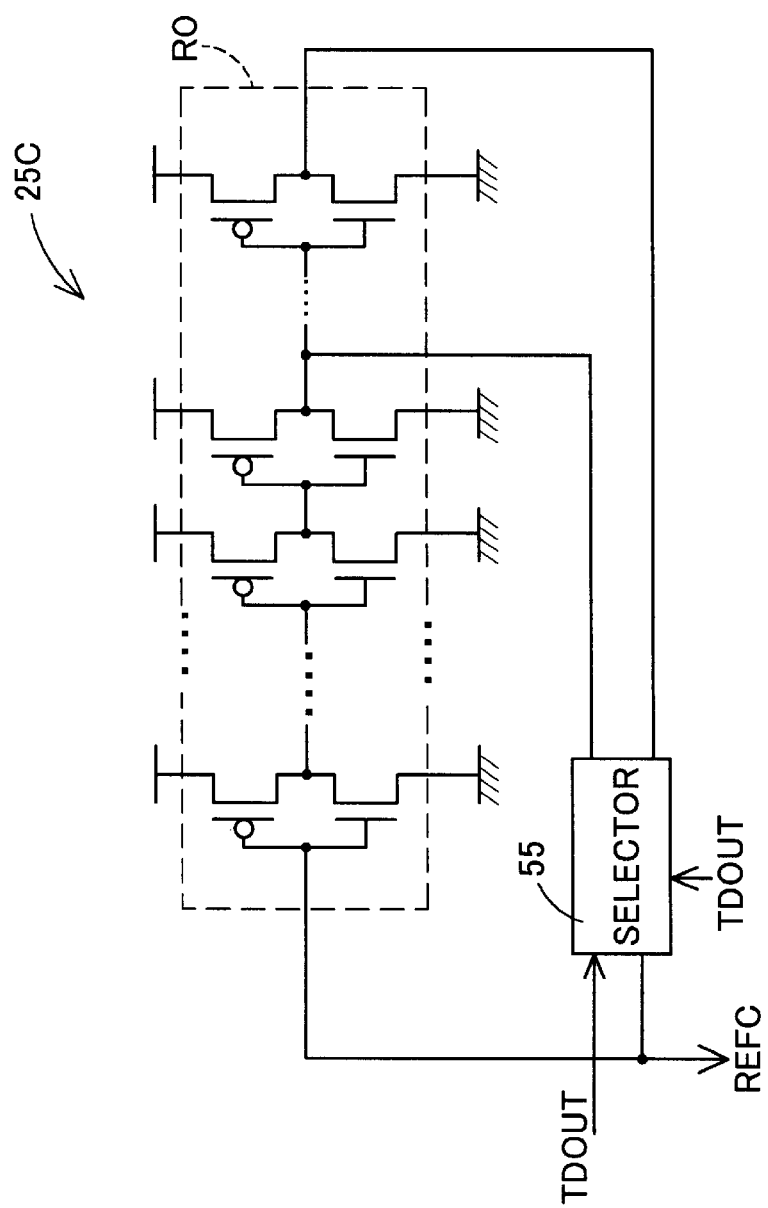
FIG. 22 is a circuit diagram showing a third specific example of the refresh control circuit.

FIG. 22 shows a third specific example. This example has the same construction as those of the oscillation circuit portions RO of the first and second specific examples. The third specific example is constructed by switching the loop stage number of the oscillation circuit portion RO by a selector 55 to make the oscillation period variable thereby to switch the refresh period tREF. The switching is made with the detected signal TDOUT which is input to the selector 55 from the temperature detecting unit 12A or 22.

Figure 23:
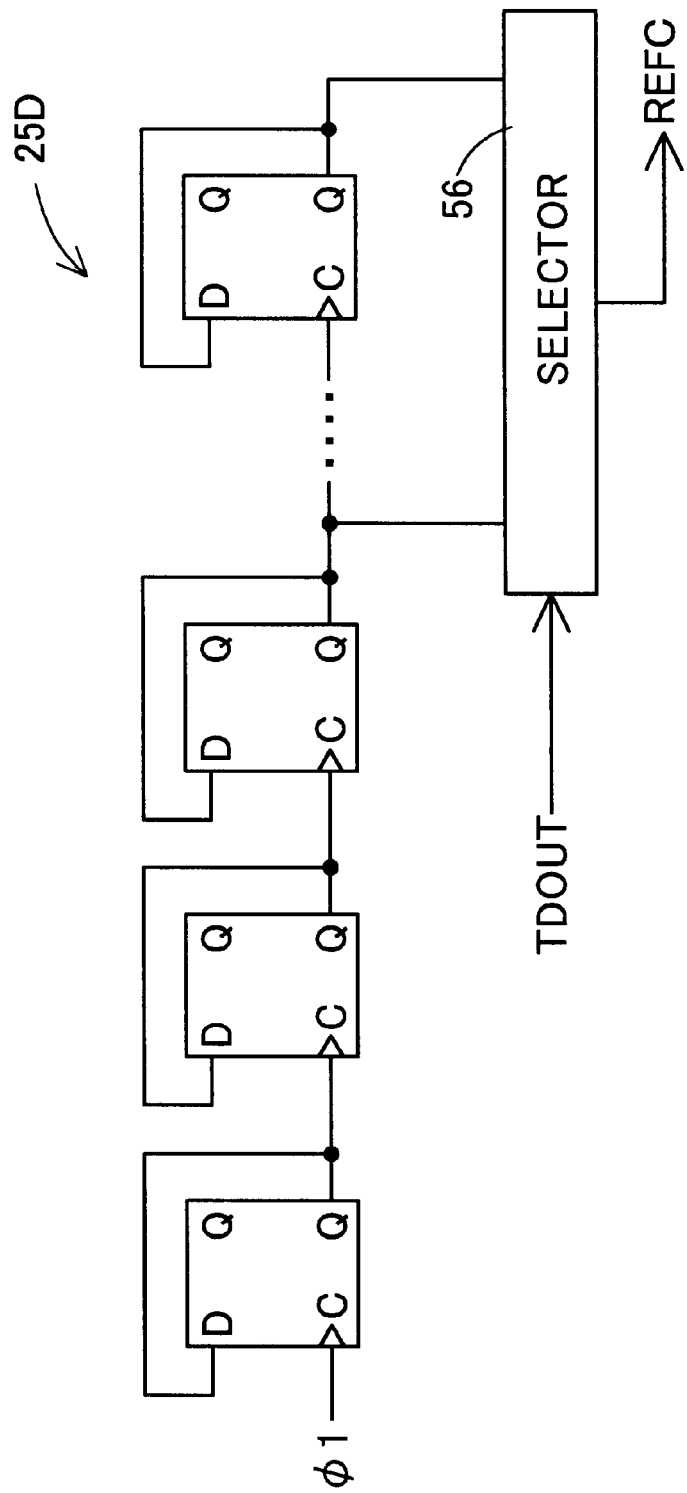
FIG. 23 is a circuit diagram showing a fourth specific example of the refresh control circuit.

FIG. 23 shows a fourth specific example. In this specific example, there is constructed a frequency dividing circuit in which D-type flip-flops are connected in series and to which an oscillation signal from the not-shown oscillation circuit is input as an input signal $\phi1$ of the first stage. In the construction, the oscillation signal at a predetermined frequency dividing ratio is suitably selected by a selector 56. The selection is done with the detected signal TDOUT which is input to the selector 56 from the temperature detecting unit 12A or 22.

According to the first and second embodiments or their modifications thus far described, the internal action or the refresh period tREF can be switched at the predetermined temperature tx0 detected by the temperature detecting unit 12A or 12B, in accordance with either the temperature dependency in the action characteristics of the semiconductor device 1 or the like having the temperature detecting function or the temperature dependency in the charge holding characteristics of the memory cell 26 or the like of the semiconductor memory 2 or the like having the temperature detecting function. As a result, the internal action or the data of the memory cell 26 or the like can be held over the wide working temperature range (e.g., from tmin to tmax).

Especially in the semiconductor memory 2 or the like, in accordance with the data holding characteristics in which the holding time of the stored charge of the memory cell becomes shorter at the higher temperature, the refresh period tREF is set short in response to the data holding time tST of the memory cell 26 or the like in the higher temperature region for the shorter data holding time tST and long in the lower temperature region for the longer data holding time tST. The data can be held in the higher temperature region, and the consumed current IDD accompanying the refresh action can be reduced by suppressing the refresh action more than necessary in the lower temperature region. Especially if the predetermined temperature tx0 for switching the refresh period tREF is set on the higher temperature than the ordinary working temperature, the refresh period tREF can be set long at the ordinary working temperature thereby to reduce the current consumption in the ordinary working state.

In the temperature detecting unit 22 of the first modification A, moreover, the bias voltage VB+ is applied to the positive supply side, and the bias voltage VB− is applied to the negative supply side, so that the voltage difference between the positive supply side and the negative supply side is kept at the predetermined voltage VB. The bias voltages VB+ and VB− are generated from the reference voltage vref to have the DC outputting characteristics for keeping the predetermined voltage difference and the equivalent in-phase transient response outputting characteristics. Between the positive/negative power supplies of the temperature detecting unit 22, therefore, the predetermined voltage VB is biased as the DC characteristics, and the voltage difference can be kept at the predetermined voltage VB in the transient responsive manner. Even with the fluctuations of the bias voltages VB+ and VB−, the stable temperature detection can be made without any fluctuation of the predetermined temperature tx0 to be detected.

Moreover, the predetermined voltage VB is lower than the voltage difference between the external supply voltage and the ground potential. Therefore, the temperature detecting unit 22 can be biased with the predetermined voltage VB having a smaller voltage fluctuation width than the specifically allowed voltage fluctuation width relating to the external supply voltage thereby to further suppress the fluctuations of the predetermined temperature tx0 to be detected.

Moreover, the construction may be modified so that the bias voltage VB+ for biasing the temperature detecting unit 12A or 12B shown in FIG. 14 is a predetermined voltage having a slight temperature dependency or a predetermined temperature dependency. By specifying the temperature dependency of the bias voltage VB+ for biasing the temperature detecting unit 12A or 12B, therefore, it is possible to improve the detection precision of the temperature detecting unit 12A or 12B.

By thus making the construction in which the predetermined voltage VB has the predetermined temperature dependency, the direction margin can be set for the temperature to be detected so that the action state at the threshold value of the temperature to be detected can be reliably changed.

With the construction having the reference units 13 and 23 for outputting the reference voltages vref, vref20 and vref05 and the regulator units 14, 24U, 24L and 42 for outputting the bias voltages VB+ and VB− to be generated from the reference voltages vref, vref20 and vref05, moreover, the bias voltages VB+ and VB− can have the equivalent DC characteristics and the equivalent in-phase transient responsive characteristics.

According to the specific example of the reference unit 13 shown in FIG. 7, moreover, the output voltage vref and its temperature characteristics change according to the resistance of the resistance element R1. If the resistance element R1 is adjusted, therefore, the predetermined voltage VB can be adjusted to have the slight temperature dependency or the predetermined temperature dependency.

If at least one of the supply paths of the bias voltages VB+ and VB− is provided with the low-pass filter or the capacitance element, moreover, the fluctuations can be suppressed against the voltage fluctuations directly or through the temperature detecting unit 12A, 12B or 22 thereby to stabilize the bias voltage VB to the temperature detecting unit 22.

If the temperature detecting unit 14 is constructed, as shown in FIG. 14, to have the positive temperature characteristic unit UP1 and the negative temperature characteristic unit DN1 in which the output characteristics changing with the temperature have temperature dependencies inverted from each other and to have the comparator A4 for comparing the output values of the two, the predetermined temperature tx0 can be detected by crossing the output signals having the characteristics inverted from each other.

Moreover, the positive temperature characteristic unit UP1 and the negative temperature characteristic unit DN1 are constructed to include the diode element D1 and the resistance elements RA and RB, and the resistance element R3 and the diode element D2. If the diode elements D1 and D2 are given the equivalent temperature characteristics and if the resistance elements RA, RB and R3 are further divided into the resistance element groups so that a plurality of output terminals are extracted from predetermined voltage dividing positions, it is then possible to detect a plurality of temperatures.

Moreover, the diode elements D1 and D2 can be formed between the well diffusion layer 61 and the source/drain diffusion layer 63 of the MOS transistors, and the well diffusion layer 61 can be separated from and made independent of the well diffusion layer 62 in which the MOS transistors are arranged. Moreover, the construction can be made between the substrate layer and the source/drain diffusion layer 65 of the MOS transistors, and the N+-type diffusion layer 67 for the shield structure to reduce the substrate noises from the outside can be formed around the source/drain diffusion layer 65. Therefore, the diode elements D1 and D2 prevented from the noise sneak from peripheral circuits can be constructed by employing the process of the prior art for the MOS transistors. Moreover, the diode elements D1 and D2 can be replaced by diode-connected bipolar elements or diode-connected MOS transistor elements.

The temperature detecting unit 12A or 12B has the construction in which the negative supply side is at the ground potential, and can achieve actions/effects similar to those of the temperature detecting unit 22. If the ground potential is then supplied from the dedicated supply path to the temperature detecting unit 12A or 12B, it is possible to prevent the noise sneak from the peripheral circuit.

Figure 24:
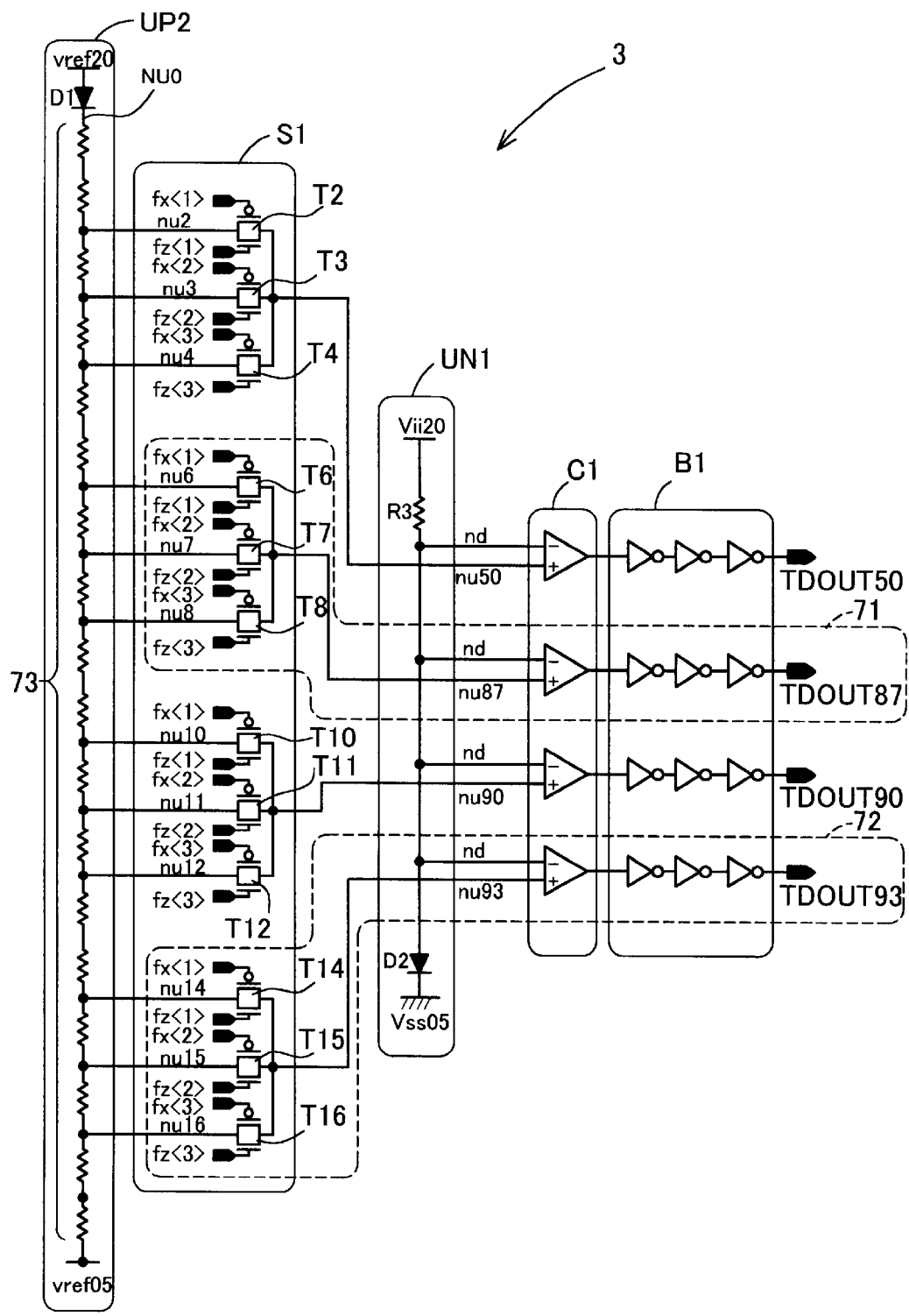
FIG. 24 is a circuit diagram showing a temperature detecting unit in a third embodiment.

FIG. 24 shows a temperature detecting unit 3 in a semiconductor device or semiconductor memory having the temperature detecting function in a third embodiment. In this construction, the detected result of the temperature detecting unit 3 is easily corrected at a testing time. In FIG. 24, a detected signal TDOUT50 is taken at a predetermined temperature tx0 (e.g., 50° C.) to be detected at an actual action time. A detected signal TDOUT90 is taken at a testing temperature (e.g., 90° C.) at a temperature characteristic testing time. Moreover, dotted portions 71 and 72 are detected signals TDOUT87 and TDOUT93 at temperatures (e.g., 87° C. and 93° C.) near the testing temperature at the temperature characteristic testing time.

A positive temperature characteristic unit UP2 is provided with a resistance element group 73 including a plurality of resistance elements in place of the resistance elements RA and RB in the positive temperature characteristic unit UP1. The voltages at the individual predetermined terminals of the resistance element group 73 are input as the positive temperature characteristic voltages Vnu50, Vnu90, Vnu87 and Vnu93 to the individual comparators of a comparator group C1. At this time, a selection group S1 selects predetermined terminals from the individual terminals nu2 to nu4, nu10 to nu12, nu6 to nu8 and nu14 to nu16 of the resistance element group 73. The selection group S1 includes transfer gates T2 to T4, T10 to T12, T6 to T8 and T14 to T16 constructed of MOS devices. Selection signals fx<2> and fz<2> are selected for the transfer gates T3, T11, T7 and T15 for selecting the set values of the predetermined temperature selections in the resistance element group 73; selection signals fx<1> and fz<1> are selected for the transfer gates T2, T10, T6 and T14 for selecting the positive corrections for the set values; and selection signals fx<3> and fz<3> are selected for the transfer gates T4, T12, T8 and T16 for selecting the negative corrections. Here, the compared results made in the comparator group C1 are inverted in logic signals, shaped in waveforms and given driving abilities by an inverted buffer group B1 so that they are output as the detected signals TDOUT 50, TDOUT90, TDOUT 87 and TDOUT 93. Here, the selected/corrected signals fx<1> to fx<3> are low active signals for driving the PMOS transistors, and the selected/corrected signals fz<1> to fz<3> are high active signals for driving the NMOS transistors.

Here will be described two kinds of correcting methods of the predetermined temperature tx0 (e.g., 50° C.) to be detected by the temperature detecting unit 3. A first method is to correct the detected signal TDOUT90 which is obtained by detecting the testing temperature (e.g., 90° C.) at the temperature characteristic testing time. In the ordinary acting state, the positive temperature characteristic voltage Vnu90 at the testing temperature (e.g., 90° C.) exceeds the negative temperature characteristic voltage Vnd so that the detected signal TDOUT90 is logically inverted to output the low level signal. If the sheet resistance of the resistance elements composing the resistance element group 73 is reduced by the dispersion or the like in the manufacture, however, the positive temperature characteristic voltage Vnu90 does not exceed the negative temperature characteristic voltage Vnd even at the testing temperature (90° C.) so that the detected signal TDOUT90 outputs the high level signal. If the corrected signals fx<1> and fz<1> are then selected to select the terminal nu10, the positive temperature characteristic voltage Vnu90 rises so that the detected signal TDOUT90 can be inverted to detect the testing temperature.

In case the sheet resistance is high, moreover, the detected signal TDOUT90 has already been the low level signal before the testing temperature (90° C.). In this case, the signals are sequentially switched from the corrected signals fx<1> and fz<1> through the selected signals fx<2> and fz<2> to the corrected signals fx<3> and fz<3> so that the detected signal TDOUT90 can take the corrected positions at the terminal positions of the resistance element group 73 to be selected by the signals inverted to the low level.

The detection of the predetermined temperature tx0 (50° C.) is constructed of the resistance division of the same resistance element group 73 as that of the detection of the testing temperature (90° C.) so that the detected signal TDOUT50 can also be correctly output by a correction similar to that made for the detected signal TDOUT90. By the same corrected signals fx<3> and fz<3>, therefore, the positive temperature characteristic voltage Vnu50 is set at the voltage of the terminal nu4. Without any test at the predetermined temperature tx0 (50° C.), the temperature detection at the predetermined temperature (50° C.) can be simultaneously corrected by the correction of the temperature detection at the testing temperature (90° C.).

In a second method, the testing temperature (90° C.) is detected with not only the detected signal TDOUT90 but also the detected signals TDOUT87 and TDOUT93. These detected signals TDOUT87 and TDOUT93 are logically inverted at two side temperatures near the higher and lower temperature sides than the testing temperature (90° C.). By making such corrections that the output logic levels of the detected signals TDOUT87 and TDOUT93 may be contrary logic levels, the errors of the detected temperatures from 87° C. to 93° C. are adjusted with respect to the testing temperature (90° C.). Moreover, corrections are made to invert the output logic level of the detected signal TDOUT90, and adjustments are made for temperature detections of the testing temperature in higher precision.

These corrections are likewise made on the detection side of the predetermined temperature tx0 (50° C.) to output the detected signal TDOUT50 so that the corrections of the temperature detections at the predetermined temperature (50° C.) can be simultaneously made with the corrections of the temperature detections at the testing temperature (90° C.) without any test at the predetermined temperature tx0 (50° C.).

Moreover, highly precise corrections can be made by the two-stage corrections on the testing temperature after the corrections to the temperatures near the higher and lower temperature sides and by the adjustments of the small temperature difference between the near temperatures.

It is also possible to properly grasp to which temperature direction of the higher or lower temperature side the detected results at the testing temperature detecting time are shifted with respect to the testing temperature.

Here, the detected portion of the testing temperature is inactive at the ordinary working time if activated only at the temperature characteristic testing time, so that the consumed current IDD will not increase.

Figure 25:
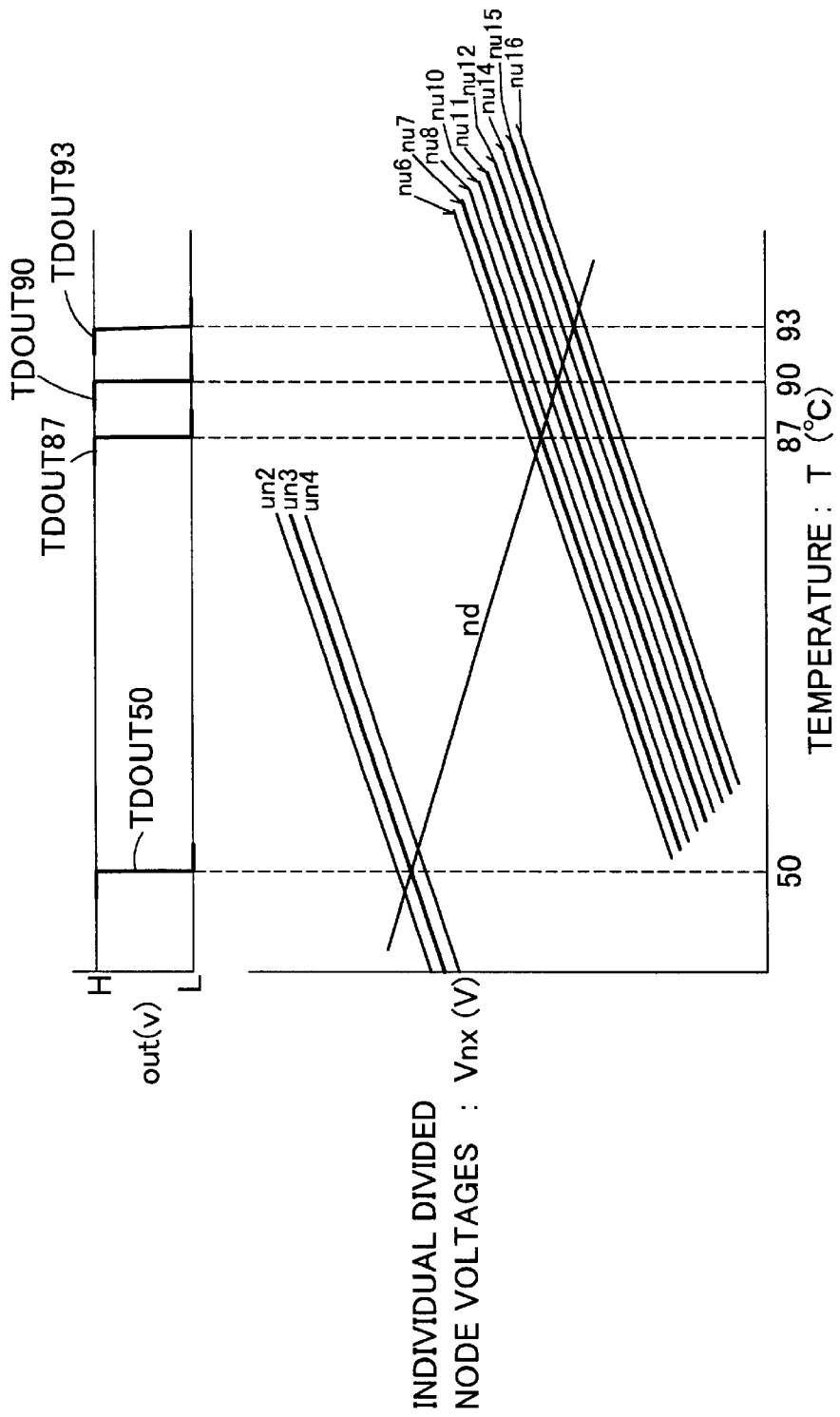
FIG. 25 is a characteristic diagram illustrating temperature characteristics at the temperature detecting unit of the third embodiment.
Figure 26:
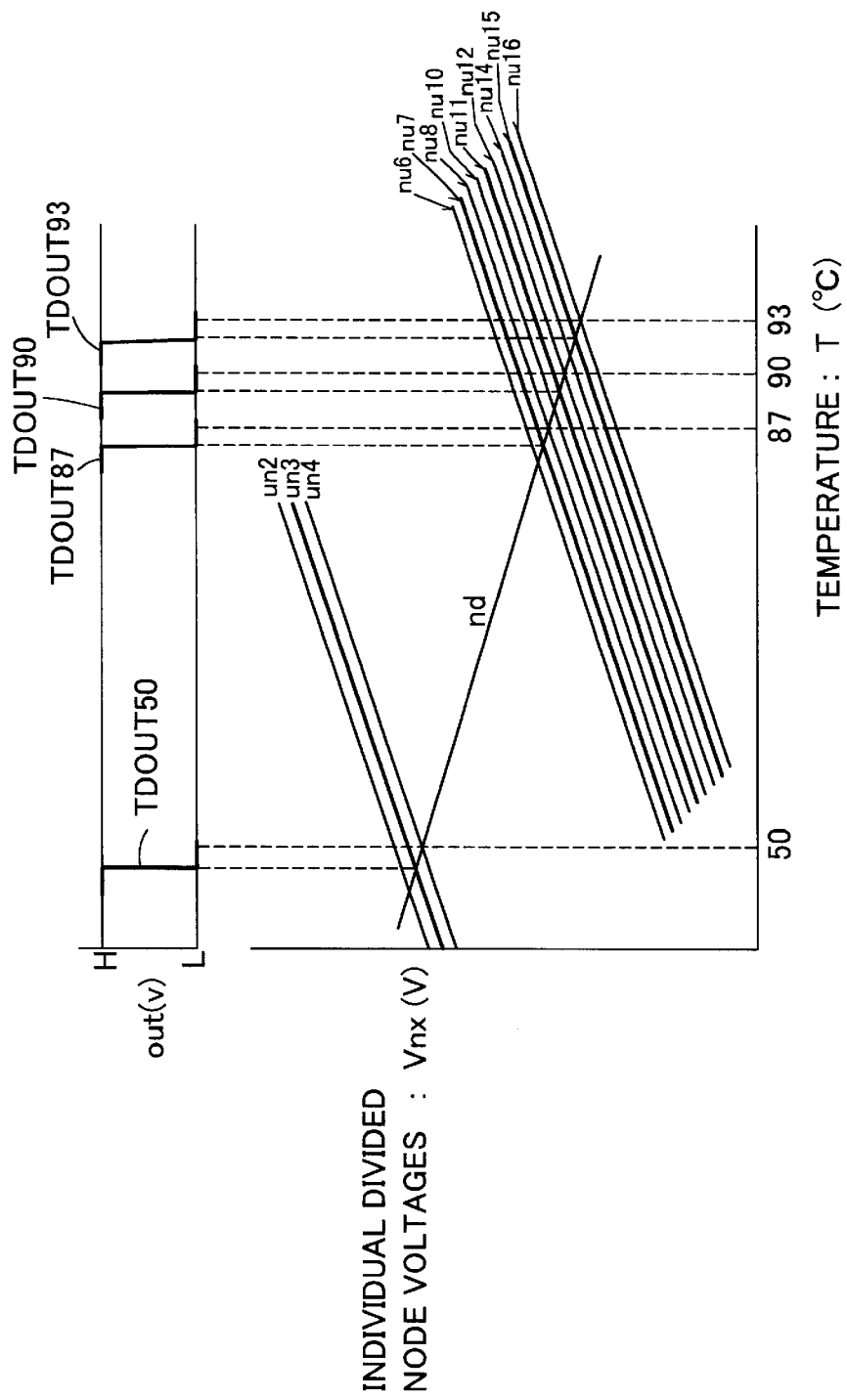
FIG. 26 is a characteristic diagram (for a higher resistance than a set value) illustrating temperature characteristics at the temperature detecting unit of the third embodiment.
Figure 27:
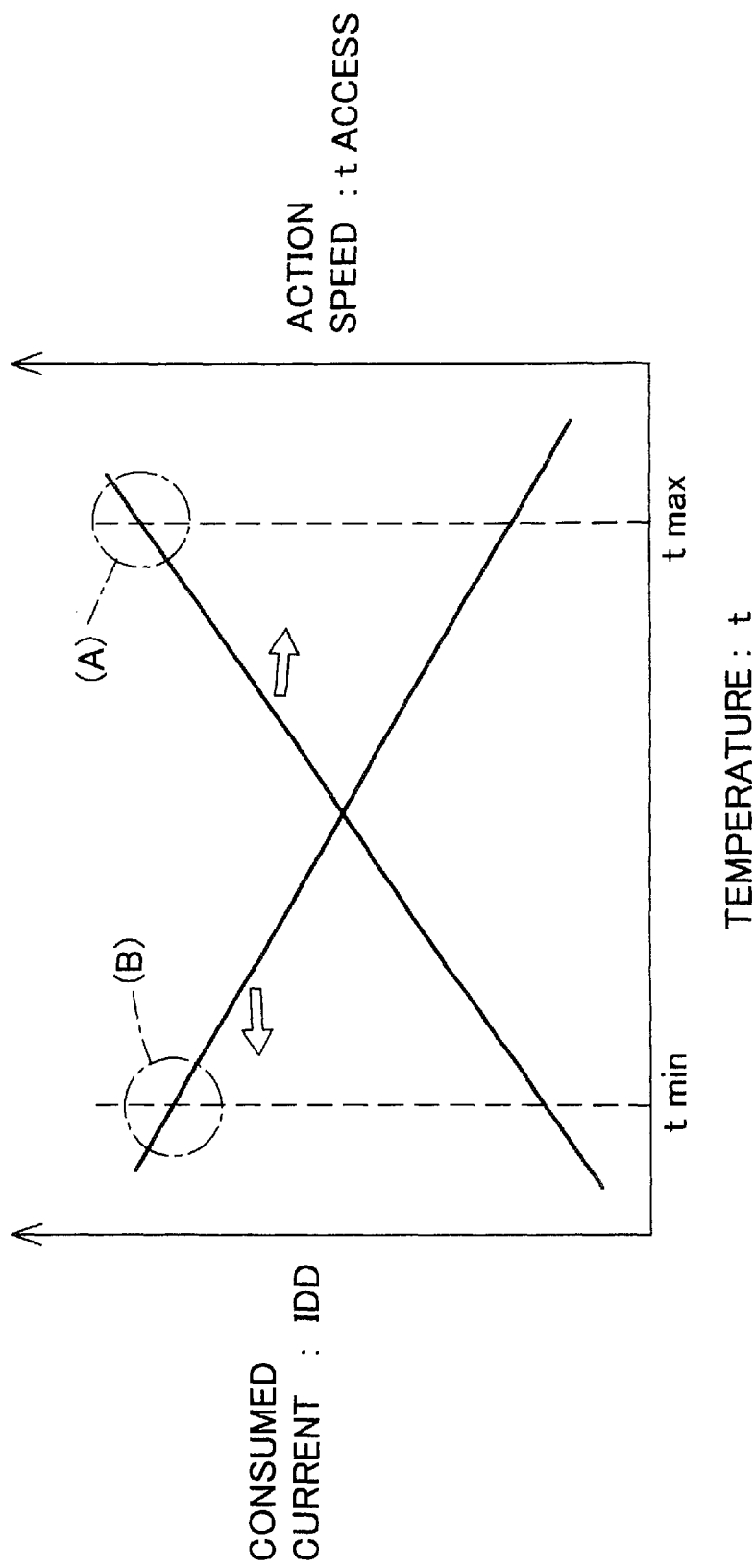
FIG. 27 is a characteristic diagram illustrating temperature characteristics of a semiconductor device made of CMOS device elements.
Figure 28:
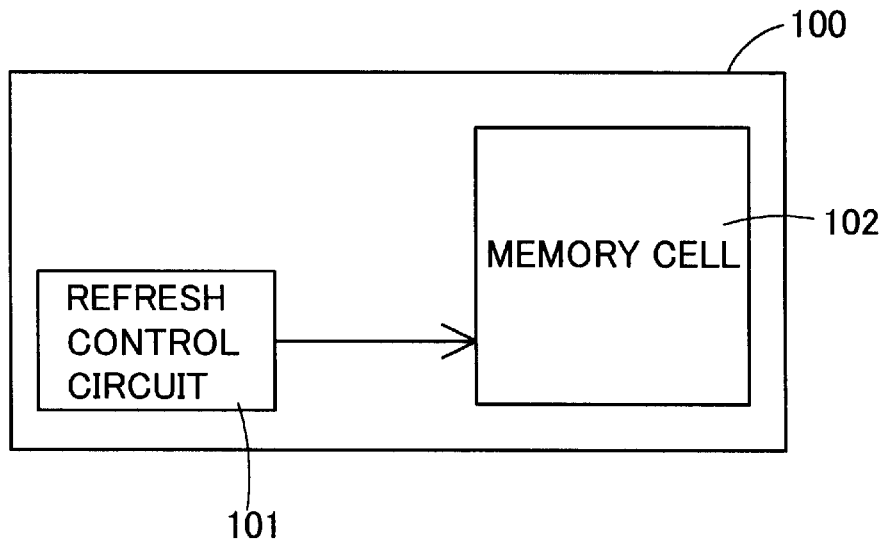
FIG. 28 is a circuit block diagram showing a refresh control unit of a semiconductor memory in the prior art.

FIGS. 25 and 26 illustrate specific examples of the temperature characteristics at the temperature detecting unit 3. FIG. 25 illustrates the case in which the individual resistances of the resistance element group 73 in the positive temperature characteristic unit UP2 are at the set values. The output terminal nd of the negative temperature characteristic unit DN1 exhibits the fixed negative temperature characteristic voltage Vnd. In response to the selections by the transfer gates T2 to T4, T10 to T12, T6 to T8 and T14 to T16, the output terminal nu of the positive temperature characteristic unit U2 outputs the voltages of the individual terminals nu2 to nu4, nu10 to nu12, nu6 to nu8 and nu14 to nu16 of the resistance element group 73. FIG. 25 illustrates three kinds of positive temperature characteristic voltages Vnu. If the selected signals fx<2> and fz<2> are selected, the terminals nu3, nu11, nu7 and nu15 are selected, and the intersections with the negative temperature characteristic voltage Vnd are set as the temperature detecting points. At the individual intersections, the logic levels of the detected signals TDOUT50, TDOUT 90, TDOUT 87 and TDOUT 93 are inverted so that the temperatures 50° C., 90° C., 87° C. and 93° C. are detected.

FIG. 26 shows the case in which the sheet resistances of the resistance elements composing the resistance element group 73 rise with respect to the set value. As the resistances of the individual resistors rise, the voltages of the individual terminals nu2 to nu4, nu10 to nu12, nu6 to nu8 and nu14 to nu16 of the resistance element group 73 uniformly rise. With these voltage rises, the intersections between the positive temperature characteristic voltages Vnu and the negative temperature characteristic voltages Vnd of the individual terminals uniformly shift to the lower temperature side. Therefore, the temperatures to be detected with the individual detected signals are shifted to the lower temperature side than the predetermined temperature. In order to eliminate these errors, the correction signals fx<3> and fz<3> are selected in place of the selection fx<2> and fz<2>. The terminals nu4, nu12, nu8 and nu16 are selected through the transfer gates T4, T12, T8 and T16 so that all the temperature detections (50° C., 90° C., 87° C. and 93° C.) can be simultaneously corrected.

According to the third embodiment thus far described, the errors between the detected results of the temperature characteristic tests of the prior art and the actual test temperatures are measured so that the temperature detecting unit can be relatively corrected on the basis of the quantities of the errors. The temperature detecting unit can be relatively corrected without the temperature detecting tests at the predetermined temperature tx0. Therefore, the action tests at the predetermined temperature tx0 need not be newly done but can be done at the time of the tests which have been made in the prior art at the maximum tmax or the minimum tmin of the working temperature range for warranting the action characteristic in the entire working temperature range (from tmin to tmax). The testing time can be shortened to compress the testing cost.

Moreover, at least two temperatures having a small temperature difference, as selected from the testing temperature or its near temperature, are detected so that the testing temperatures are within a small temperature difference in the state where the two detected results are contrary to each other. By adjusting the small temperature difference, the detecting precision of the testing temperature can be adjusted to adjust the precision of the erroneous quantities of the detected results thereby to correct the temperature detecting unit 3 relatively in the high precision.

Moreover, at least two temperatures having a small temperature difference, as selected from the testing temperature or its near temperature, are detected. It is, therefore possible to judge to which side of the higher/lower temperature sides than the actual testing temperature the detected results are shifted, thereby to execute the correcting procedure efficiently.

In the construction, moreover, after the difference till the detected results of the detected signals TDOUT87 and TDOUT93 becomes contrary has been corrected, the difference till the detected result of the detected signal TDOUT90 is inverted is further corrected. As a result, the detecting precision of the testing temperature can be improved to correct the temperature detecting unit 3 relatively in the high precision.

Moreover, the temperature detecting unit 3 can be given the same correction quantity as that to the detected error quantity of the testing temperature at the temperature characteristic testing time.

Moreover, the individual terminals nu2 to nu4, nu10 to nu12, nu6 to nu8 and nu14 to nu16 to be selectively connected with the positive temperature characteristic voltages Vnu50, Vnu90, Vnu87 and Vnu93 for the temperature detections are resistance-divided by the resistance element group 73 so that they are mutually proportioned. Therefore, the correction of the predetermined temperature tx0 can be equalized to the error quantity in the testing temperature.

Moreover, the detecting portion of the testing temperature is activated only at the temperature characteristic testing time and is left inactive at the ordinary working time so that no current is consumed thereby not to increase the consumed current IDD.

Here, the present invention should not be limited to the foregoing first to third embodiments but could naturally be improved and modified in various manners within the scope not departing from the gist thereof.

For example, the present embodiment has been described by detecting the temperatures at one or two points. However, the present invention should not be limited thereto but could detect the temperatures at three or more points. In response to the temperature detections of three or more points, the action states of the semiconductor device and so on could be switched.

Moreover, the present invention has been described on the case in which the refresh period is digitally switched in response to the temperature detections. However, the refresh period could be made analogously variable by changing the bias current value or the bias voltage value before and after the detected temperature.

Moreover, the predetermined voltage has taken the constant value, but the present invention should not be limited thereto. It goes without saying that the predetermined voltage might disperse within a constant allowable voltage width if the circuit construction allows.

Moreover, the third embodiment has been described on the case in which the center positions at the individual terminals of the resistance element group 73 are set with respect to the detections of the individual temperatures so that the positive/negative correction terminals are set before and after the center positions. If the correcting directions are known in advance, however, they could be arranged largely in either direction. Moreover, it goes without saying that the number of the correction terminals could be increased/decreased, if necessary.

Moreover, the second method of the third embodiment has been described on the case in which the testing temperatures are detected not only at the setting terminal of the testing temperature (90° C.) but also at the two side terminals. However, the present invention should not be limited thereto, but similar effects could be achieved even for the combination between the detected signal TDOUT90 of the testing temperature, the detected signal TDOUT87 of the near temperature (87° C.) on the lower temperature side or the detected signal TDOUT93 of the near temperature (93° C.) on the higher temperature side or for the combination between the two temperature points of the detected signals TDOUT87 and TDOUT93. If four or more temperature points are employed, on the contrary, it is possible to properly grasp the deviation amount or its direction between the detected result and the actual testing temperature at the initial detecting time of the testing temperature.

According to the present invention, it is possible to provide the semiconductor device having the temperature detecting function to detect the predetermined temperature with little dispersion and to optimize the acting state in response to the predetermined temperature detected, the testing method, and the refresh control method for the semiconductor storage device having the temperature detecting function.

What is claimed is:

1. A semiconductor device having a temperature detecting function, comprising:
    a temperature detecting unit for detecting a predetermined temperature; and
    a voltage biasing unit for outputting a predetermined voltage free from temperature dependency or a predetermined voltage having a predetermined temperature dependency, to bias the temperature detecting unit,
    wherein the temperature detecting unit includes:
        a voltage dropping unit connected with the side of the predetermined voltage and having a voltage dropping characteristics of a negative temperature characteristics,
        wherein when the temperature detection is to be made on the basis of an output voltage generated through the voltage dropping unit and having positive temperature characteristics,
    in case the acting state is to be changed at a temperature same as or higher than the predetermined temperature to be detected, the predetermined voltage has either negative temperature characteristics for setting the voltage value on a higher temperature side to a set value or positive temperature characteristics for setting the voltage value on a lower temperature side to a set value, and
    in case the acting state is to be changed at a temperature same as or lower than the predetermined temperature to be detected, the predetermined voltage has either positive temperature characteristics for setting the voltage value on the higher temperature side to a set value or negative temperature characteristics for setting the voltage value on the lower temperature side to a set value.

2. A semiconductor device having a temperature detecting function according to claim 1,
    wherein the voltage dropping unit includes a diode element.

3. A semiconductor device having a temperature detecting function, comprising:
    a temperature detecting unit for detecting a predetermined temperature;
    a first voltage biasing unit for outputting a first voltage to bias the positive supply side of the temperature detecting unit; and
    a second voltage biasing unit for outputting a second voltage dropped by a predetermined voltage from the first voltage biasing unit, to bias the negative supply side of the temperature detecting unit,
    wherein the temperature detecting unit is biased with the predetermined voltage.

4. A semiconductor device having a temperature detecting function according to claim 3,
    wherein the first and second voltage biasing units have DC output characteristics for keeping the predetermined voltage as a voltage difference between the first and second voltages and have equivalent in-phase transient responsive output characteristics.

5. A semiconductor device having a temperature detecting function according to claim 3,
    wherein the predetermined voltage is smaller than the voltage difference between an external supply voltage and the ground potential.

6. A semiconductor device having a temperature detecting function according to claim 3,
    wherein at least one of the first and second voltage biasing units includes:
        a reference unit for outputting a reference voltage; and
        a regulator unit for outputting the predetermined voltage on the basis of the reference voltage.

7. A semiconductor device having a temperature detecting function according to claim 6,
    wherein the reference unit includes:
        a first conduction type MOS transistor;
        a resistance element connected with the source terminal of the first conduction type MOS transistor; and
        a current mirror circuit composed of second conduction type MOS transistors and having a current input terminal connected with the drain terminal of the first conduction type MOS transistor and a current output terminal connected with the gate terminal of the first conduction type MOS transistor thereby to construct a feedback loop, and wherein by setting the resistance element of the predetermined resistance, the reference voltage is adjusted to cancel a temperature dependency or to have a predetermined temperature dependency.

8. A semiconductor device having a temperature detecting function according to claim 3, wherein at least one of the first and second voltage biasing units includes:

a first conduction type MOS transistor;

a resistance element connected with the source terminal of the first conduction type MOS transistor; and a current mirror circuit composed of second conduction type MOS transistors and having a current input terminal connected with the drain terminal of the first conduction type MOS transistor and a current output terminal connected with the gate terminal of the first conduction type MOS transistor thereby to construct a feedback loop, and wherein by setting the resistance element of the predetermined resistance, at least one of the first and second voltages is adjusted to cancel a temperature dependency or to have a predetermined temperature dependency.

9. A semiconductor device having a temperature detecting function according to claim 3, wherein the supply path of at least one of the first and second voltages from at least one of the first and second biasing units to the temperature detecting unit includes a low-pass filter or a capacitance element.

10. A semiconductor device having a temperature detecting function according to claim 3, wherein the temperature detecting unit includes:

a predetermined temperature detecting unit or detecting the predetermined temperature;

a testing temperature detecting unit for detecting the testing temperature at a temperature characteristic testing time; and a correction unit for correcting the predetermined temperature detecting unit on the basis of an error quantity of the detected result of the testing temperature detecting unit in the testing temperature.

11. A semiconductor device having a temperature detecting function according to claim 3, wherein the temperature detecting unit includes:

a predetermined temperature detecting unit or detecting the predetermined temperature;

at least any two of a testing temperature detecting unit having a detecting temperature at a temperature characteristic testing time set to the testing temperature, a first near temperature detecting unit set to a first near temperature having an allowable detecting temperature difference on a higher temperature side, and a second near temperature detecting unit set to a second near temperature having an allowable detecting temperature difference on a lower temperature side; and a correction unit for correcting the predetermined temperature detecting unit on the basis of equivalent corrections individually on the at least two detection units so that the detected results of the two detection units having the two end detected temperatures set among at least any two of the detection units may be contrary to each other at the time of detecting the testing temperature.

12. A semiconductor device having a temperature detecting function according to claim 11, further comprising:

the testing temperature detecting unit, the first near temperature detecting unit and the second near temperature detecting unit, and wherein the equivalent corrections to be made on the testing temperature detecting unit and the first and second near temperature detecting units by detecting the testing temperature include:

a first correction to correct the difference till the detected results from the first and second near temperature detecting units are contrary to each other; and a second correction to correct the difference till the detected result from the testing temperature detecting unit is inverted after the detected results from the first and second near temperature detecting units are contrary to each other.

13. A semiconductor device having a temperature detecting function according to claim 11, wherein the correction unit subjects to the predetermined temperature detecting unit a correction quantity equivalent to an error quantity for the at least two detection units.

14. A semiconductor device having a temperature detecting function according to claim 11, wherein the predetermined temperature detecting unit, the testing temperature detecting unit, the first near temperature detecting unit and the second near temperature detecting unit include:

a resistance element group to which a voltage having a temperature dependency is applied; and a selection unit for selecting the predetermined voltage dividing positions to be divided by the resistance element group.

15. A semiconductor device having a temperature detecting function according to claim 14, wherein the correction unit includes:

a correction selecting unit for selecting the adjoining voltage dividing position adjoining the predetermined voltage dividing position.

16. A semiconductor device having a temperature detecting function according to claim 11, wherein the testing temperature detecting unit, the first near temperature detecting unit and the second near temperature detecting unit are activated only at the temperature characteristic testing time.

17. A semiconductor device having a temperature detecting function according to claim 3, wherein the temperature detecting unit includes:

first and second circuits connected between the first voltage and the second voltage and having output characteristics changed with the temperature in temperature dependencies inverted from each other; and a comparator for comparing the output values of the first and second circuits.

18. A semiconductor device having a temperature detecting function according to claim 17, wherein the first circuit includes:

a first circuit unit connected with the first voltage and having a temperature dependency; and a first resistance unit connected with the second voltage, wherein either the node between the first circuit unit and the first resistance unit or a predetermined position of the first resistance unit are constructed as an output terminal, wherein the second circuit includes:

a second circuit unit connected with the second voltage and having a temperature dependency in the same direction as that of the first circuit unit; and a second resistance unit connected with the first voltage, and wherein either the node between the second circuit unit and the second resistance unit or a predetermined position of the second resistance unit are constructed as an output terminal.

19. A semiconductor device having a temperature detecting function according to claim 18, wherein at least one of the first and second resistance units has a first or second resistance element group, and wherein a predetermined voltage dividing position to be voltage-divided by the first or second resistance element group is the predetermined position.

20. A semiconductor device having a temperature detecting function according to claim 19, further comprising:

a predetermined temperature detecting unit for detecting a predetermined temperature by using first predetermined positions of at least one of the first and second resistance element groups of at least one of the first and second resistance element groups as first output terminals; and at least any two of a testing temperature detecting unit using second predetermined positions of at least one of the first and second resistance element groups as second output terminals and having a detecting temperature at a temperature characteristic testing time set to the testing temperature, a first near temperature detecting unit using third predetermined positions of at least one of the first and second resistance element groups as third output terminals and having the detected temperature set to a first near temperature having an allowable detecting temperature difference on a higher temperature side, and a second near temperature detecting unit using fourth predetermined positions of at least one of the first and second resistance element groups as fourth output terminals and having the detected temperature set to a second near temperature having an allowable detecting temperature difference on a lower temperature side.

21. A semiconductor device having a temperature detecting function according to claim 18, wherein the first and second circuit units are diode elements, diode-connected bipolar elements or diode-connected MOS transistor elements.

22. A semiconductor device having a temperature detecting function according to claim 21, wherein the diode elements are formed between a well diffusion layer and the source/drain diffusion layer of the MOS transistors, and wherein the well diffusion layer is separated from and made independent of the well diffusion layer in which the MOS transistors are arranged.

23. A semiconductor device having a temperature detecting function according to claim 21, wherein the diode elements are formed between a substrate layer and the source/drain diffusion layer of the MOS transistors, and wherein a shield structure for suppressing the influences of the substrate noises from the outside is formed around the source/drain diffusion layer.

24. A semiconductor device having a temperature detecting function according to claim 3, wherein the semiconductor device is a semiconductor storage device, and further comprising a refresh period control unit for switching the period of a refresh action in accordance with the predetermined temperature detected by the temperature detecting unit.

25. A semiconductor device having a temperature detecting function according to claim 24, wherein the refresh period control unit sets the period of the refresh action short at the predetermined temperature or higher or at a higher temperature than the predetermined temperature and long at the predetermined temperature or lower or at a lower temperature than the predetermined temperature.

26. A method for testing a semiconductor device having a temperature detecting function, comprising:

a testing temperature detecting step of detecting a testing temperature at a temperature characteristic testing time;

an error measuring step of measuring an error quantity of the detected result of the testing temperature; and a correction step of correcting a temperature detecting unit for detecting a predetermined temperature, on the basis of the measured error quantity.

27. A method for testing a semiconductor device having a temperature detecting function, comprising:

a testing temperature detecting step of making at least two kinds of the detections of a testing temperature, the detection of a first near temperature having a an allowable detecting temperature difference on a higher temperature side with respect to the testing temperature and the detection of a second near temperature having an allowable detecting temperature difference on lower temperature side, at a temperature characteristic testing time;

an error measuring step of measuring the difference till the detected results of the two end temperatures of the at least two kinds of detections are contrary to each other, as a detection error; and a correction step of correcting a temperature detecting unit for detecting a predetermined temperature on the basis of the measured error quantity.

28. A method for testing a semiconductor device having a temperature detecting function according to claim 27, wherein the testing temperature detecting step performs the detection of the testing temperature, the detection of the first near temperature and the detection of the second near temperature, and wherein the error measuring step includes:

a first error measuring step of measuring the difference till the detected results of the first and second near temperatures are contrary to each other, as a detection error; and a second error measuring step of measuring the difference till the detected results of the testing temperature is inverted after the detected results of the first and second near temperatures are contrary, as a detection error.

29. A method for testing a semiconductor device having a temperature detecting function according to claim 27, wherein the correction step performs a correction equivalent to the error difference measured by the error measuring step, on the temperature detecting unit.

30. A method for testing a semiconductor device having a temperature detecting function according to claim 27, wherein the correction at the correction step is performed by selecting a suitable voltage dividing position from a resistance element group which is contained in the temperature detecting unit and to which a voltage having a temperature dependency is applied.

31. A refresh control method of a semiconductor storage device having a temperature detecting function,
   wherein a period of the refresh action is set short when the detecting temperature is at or higher than a predetermined temperature or higher than the predetermined temperature, and
   the period of the refresh action is set long when the detecting temperature is at or lower than a predetermined temperature or lower than the predetermined temperature.

32. A semiconductor device having a temperature detecting function, comprising:
   a temperature detecting unit for detecting a predetermined temperature; and
   a voltage biasing unit for outputting a predetermined voltage free from temperature dependency or a predetermined voltage having a predetermined temperature dependency, to bias the temperature detecting unit,
   wherein the temperature detecting unit includes:
      a voltage dropping unit connected with the side of the predetermined voltage and having a voltage dropping characteristics of a positive temperature characteristics,
      wherein when the temperature detection is to be basis of an output voltage generated through the voltage dropping unit and having negative temperature characteristics,
      in case the acting state is to be changed at a temperature same as or higher than the predetermined temperature to be detected, the predetermine voltage has either positive temperature characteristics for setting the voltage value on a higher temperature side to a set value or negative temperature characteristics for setting the voltage value on a lower temperature side to a set value, and
      in case the acting state is to be changed at a temperature same as or lower than the predetermined temperature to be detected, the predetermine voltage has either negative temperature characteristics for setting the voltage value on the higher temperature side to a set value or positive temperature characteristics for setting the voltage value on the lower temperature side to a set value.

33. A semiconductor device having a temperature detecting function according to claim 32,
   wherein the voltage dropping unit includes an active load of MOS transistors.

* * * * *